(12) United States Patent
Abadeer et al.

(10) Patent No.: US 7,132,325 B2
(45) Date of Patent: Nov. 7, 2006

(54) TEST STRUCTURE AND METHODOLOGY FOR SEMICONDUCTOR STRESS-INDUCED DEFECTS AND ANTIFUSE BASED ON SAME TEST STRUCTURE

(75) Inventors: Wagdi W. Abadeer, Jericho, VT (US); Eric Adler, Jericho, VT (US); Jeffrey S. Brown, Middlesex, VT (US); Robert J. Gauthier, Jr., Hinesburg, VT (US); Jonathan M. McKenna, Ann Arbor, MI (US); Jed H. Rankin, South Burlington, VT (US); Edward W. Sengle, Hinesburg, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 10/731,511

(22) Filed: Dec. 9, 2003

(65) Prior Publication Data
US 2004/0113234 A1    Jun. 17, 2004

Related U.S. Application Data

(62) Division of application No. 10/449,426, filed on May 30, 2003, now Pat. No. 6,770,907.

(51) Int. Cl.
*H01L 21/8242* (2006.01)
(52) U.S. Cl. .................................... 438/248
(58) Field of Classification Search ............ 438/142, 438/145, 149, 151, 157, 176, 184, 193, 195–198, 438/200–203, 206–207, 209–211, 218, 237, 438/5–7, 10–11, 14, 16–18, 22–24, 29, 31, 438/34–36, 104, 107–114, 118, 121–123, 438/128–130, 135
See application file for complete search history.

(56) References Cited

U.S. PATENT DOCUMENTS

| | | | |
|---|---|---|---|
| 5,285,101 A | * | 2/1994 | Kikuchi ................ 257/593 |
| 5,311,051 A | * | 5/1994 | Tukizi ................ 257/409 |
| 5,362,663 A | * | 11/1994 | Bronner et al. ........ 438/241 |
| 5,418,738 A | | 5/1995 | Abadeer et al. |

(Continued)

OTHER PUBLICATIONS

Hirth et al., Theory of Dislocations, John Wiley & Sons Publishers, Second Edition.

(Continued)

*Primary Examiner*—Michael Lebentritt
*Assistant Examiner*—Andre' Stevenson
(74) *Attorney, Agent, or Firm*—Michael Lestrange

(57) ABSTRACT

A method for detecting semiconductor process stress-induced defects. The method comprising: providing a polysilicon-bounded test diode, the diode comprising a diffused first region within an upper portion of a second region of a silicon substrate, the second region of an opposite dopant type from the first region, the first region surrounded by a peripheral dielectric isolation, a peripheral polysilicon gate comprising a polysilicon layer over a dielectric layer and the gate overlapping a peripheral portion of the first region; stressing the diode; and monitoring the stressed diode for spikes in gate current during the stress, determining the frequency distribution of the slope of the forward bias voltage versus the first region current at the pre-selected forward bias voltage and monitoring, after stress, the diode for soft breakdown. A DRAM cell may be substituted for the diode. The use of the diode as an antifuse is also disclosed.

19 Claims, 22 Drawing Sheets

U.S. PATENT DOCUMENTS

| | | | |
|---|---|---|---|
| 5,448,513 A | | 9/1995 | Hu et al. |
| 5,543,348 A | * | 8/1996 | Hammerl et al. ............ 438/249 |
| 5,561,373 A | | 10/1996 | Itoh |
| 5,654,895 A | | 8/1997 | Bach et al. |
| 5,666,049 A | | 9/1997 | Yamada et al. |
| 5,798,649 A | | 8/1998 | Smayling et al. |
| 5,831,446 A | | 11/1998 | So et al. |
| 5,841,182 A | * | 11/1998 | Linn et al. ................... 257/532 |
| 5,846,848 A | | 12/1998 | Chih-Sheng et al. |
| 5,867,033 A | | 2/1999 | Sporck et al. |
| 5,872,449 A | | 2/1999 | Gouravaram et al. |
| 5,898,629 A | | 4/1999 | Beffa et al. |
| 5,903,012 A | | 5/1999 | Boerstler |
| 6,114,182 A | | 9/2000 | Tabara |
| 6,124,143 A | | 9/2000 | Sugasawara |
| 6,441,396 B1 | * | 8/2002 | Adams et al. ................. 257/48 |
| 6,465,370 B1 | * | 10/2002 | Schrems et al. ............ 438/783 |
| 6,624,031 B1 | * | 9/2003 | Abadeer et al. ............ 438/268 |
| 6,770,535 B1 | * | 8/2004 | Yamada et al. .............. 438/270 |
| 6,770,907 B1 | * | 8/2004 | Abadeer et al. .............. 257/48 |
| 6,825,078 B1 | * | 11/2004 | Huang ........................ 438/242 |
| 6,987,043 B1 | * | 1/2006 | Kujirai et al. ............... 438/243 |
| 7,030,440 B1 | * | 4/2006 | Huang ........................ 257/296 |
| 2002/0025622 A1 | * | 2/2002 | Schrems et al. ............ 438/238 |
| 2003/0207537 A1 | * | 11/2003 | Abadeer et al. ............. 438/268 |
| 2004/0067614 A1 | * | 4/2004 | Hidaka et al. ............... 438/200 |

OTHER PUBLICATIONS

P.G. Neudeck et al., Breakdown Degradation Associated With Elementary Screw Dislocations in 4H-SIC p+ n Junction Rectifiers, Solid State Electronics, vol. 42, No. 12, 1998, pp. 2157-2164.

Satoh et al., Degradation of Dieletric Breakdown Field of Thermal SiO2 Films Due to Structural Defects in Czochralski Silicon Substrates, J. Appl. Phys. 79 (10), May 15, 1996, pp. 7944-7957.

H. Miura et al., New Mechanical Reliability Issues for Deep Submicron Devices, IEEE Semiconductor Manufacturing Technology Workshop, (Cat. No. 98EX1330), 1998, pp. 140-147.

H. Miura et al., Mechanical Stress Simulation During Gate Formation of MOS Devices Considering Crystallization Induced Stress of Phosphorus Doped Silicon Thin Films, Journal of Microelectronics, (UK), vol. 26, No. 2-3, Mar. 1995, pp. 249-253.

H. Miura et al., Mechanical Stress Simulation for Highly Reliable Deep Submicron Devices, IEICE Trans. Electron. (Japan), Inst. Elextron. Inf. & Commun. Eng., vol. E82-C, No. 6, Jun. 1999, pp. 830-838.

S. Wang et al., MOS Transistor With High Leakage Failure Caused by LOCOS Dislocation, Semiconductor Manufacturing Technology Workshop, Taiwan Semicond. Manuf. Company, Hsinchu, Taiwan, Oct. 1996, pp. 22-23.

S. H. Voldman et al., TLM: A Trench Leakage Monitor for a Four Megabit SPT DRAM Technology, IBM, Burlington, Technical Report, TR 19.90539, Jul. 1990.

M. Noguchi et al., 0.29 $\mu m^2$ Trench Cell Technologies for 1 Gbit DRAMs With Open/Folded Bit-Lane Layout and Selective Growth Technique, 1995 Symposium on VLSI Technology Digest of Technical Papers.

P. Bakeman et al., A High Performance 16-Mbit DRAM Technology, 1990 Symposium on VLSI Technology Digest of Technical Papers.

T. Pompl et al., Investigation of Ultra-Thin Gate Oxide Reliability Behavior by Separate Characterization of Soft Breakdown and Hard Breakdown, Proceedings of the International Reliability Physics Symposium, San Jose CA, Apr. 10-13, 2000, pp. 40-47.

* cited by examiner

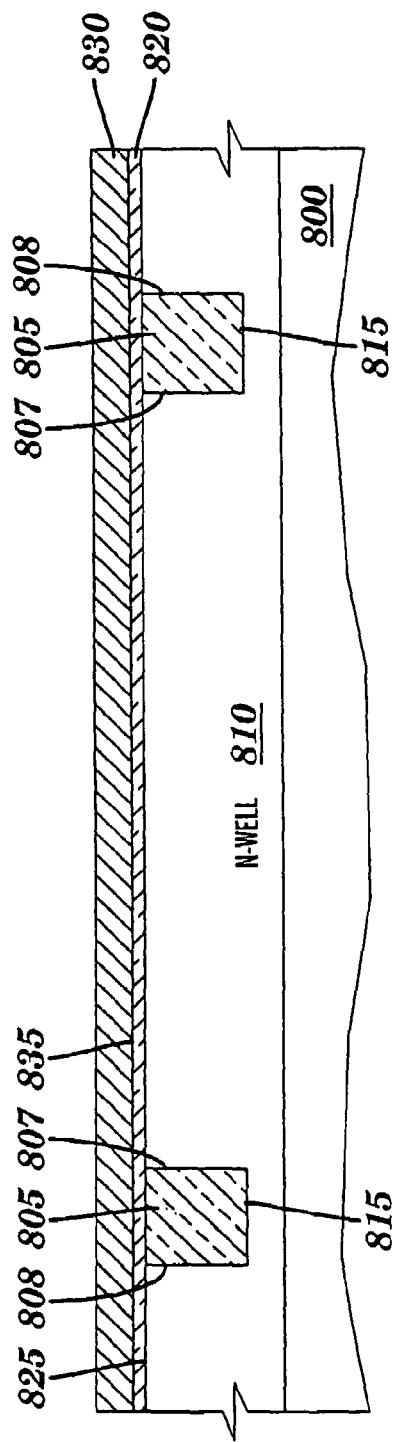
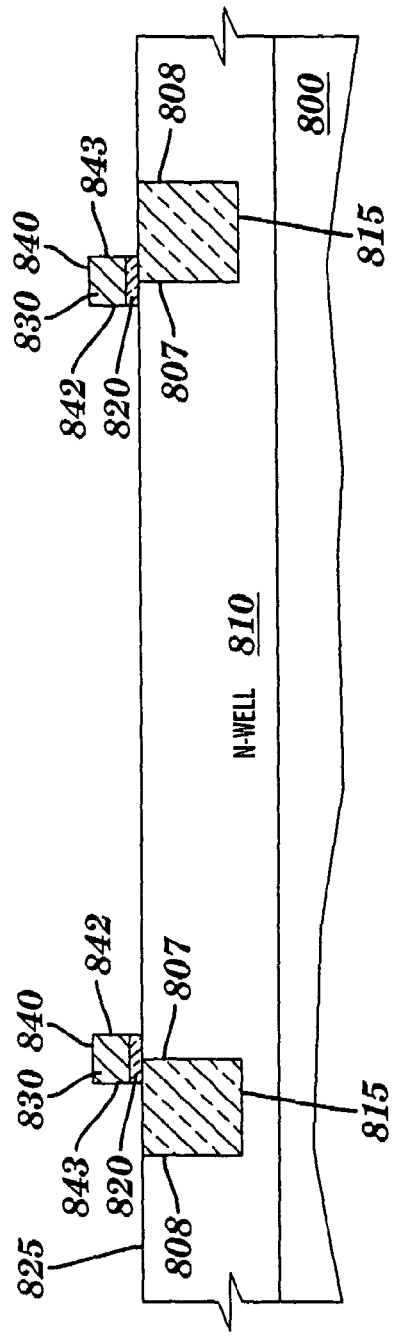
FIG. 15C
FIG. 15D

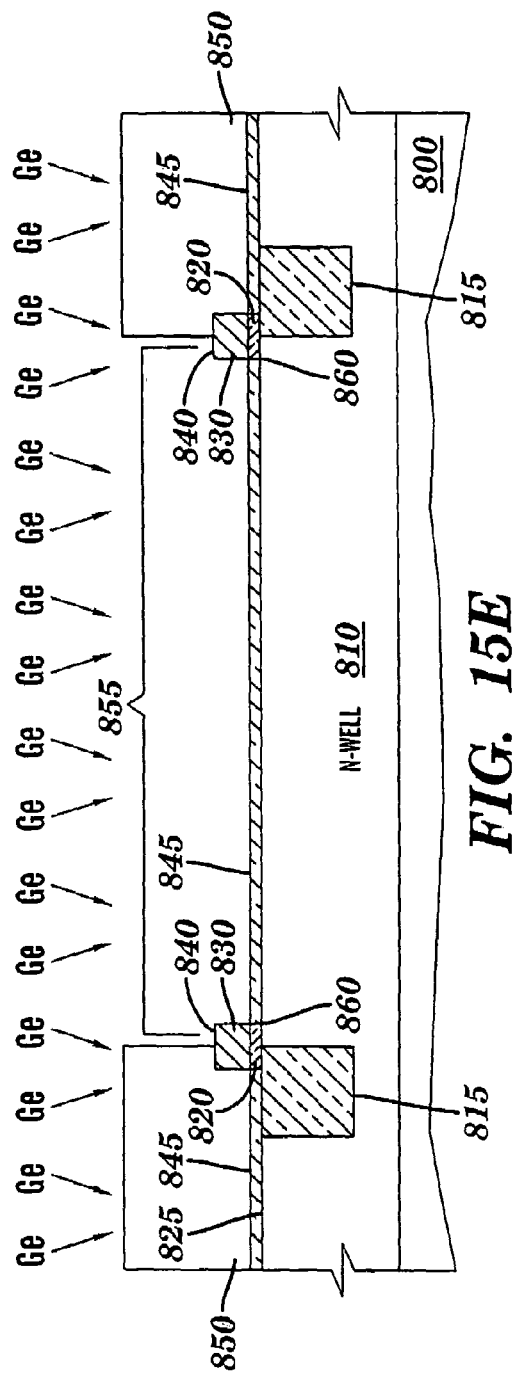
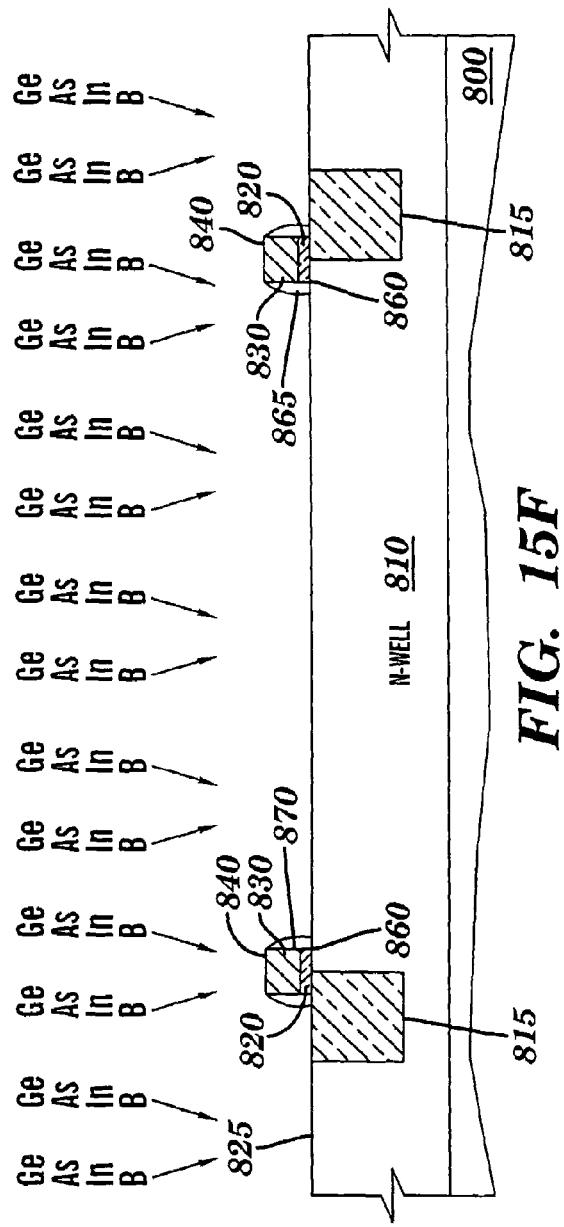

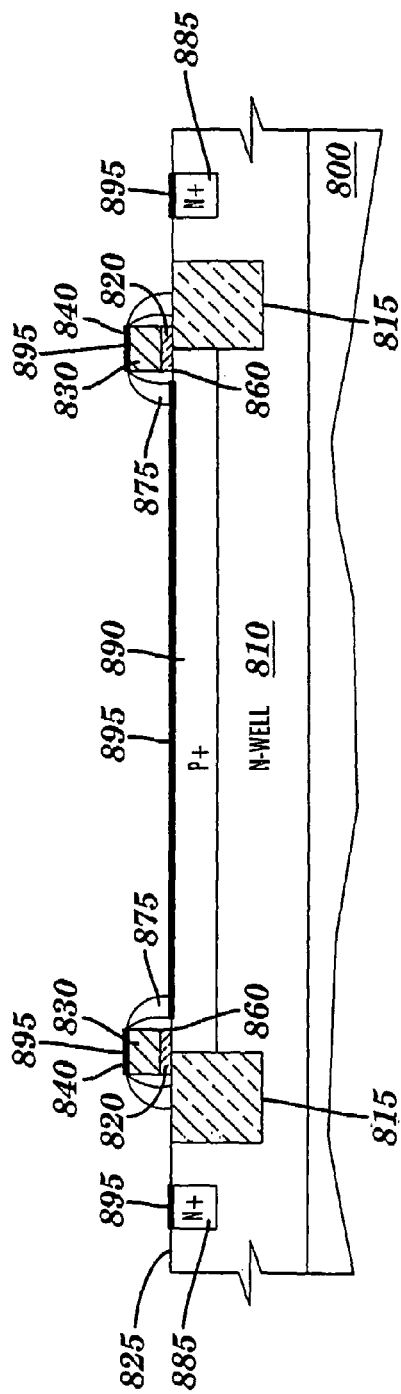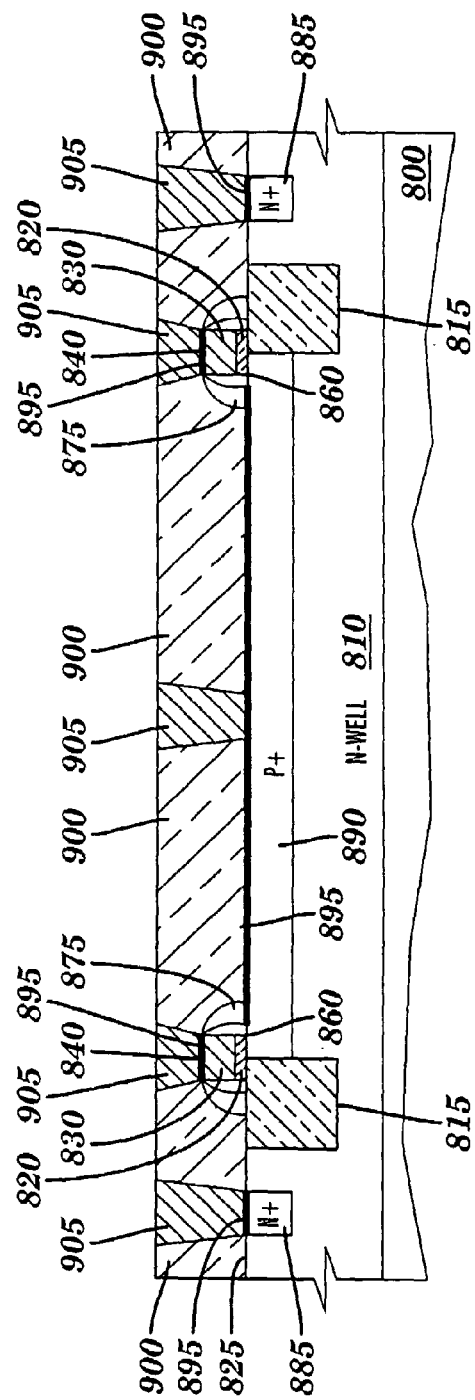

TEST STRUCTURE AND METHODOLOGY FOR SEMICONDUCTOR STRESS-INDUCED DEFECTS AND ANTIFUSE BASED ON SAME TEST STRUCTURE

This application is a division of application Ser. No. 10/449,426, filed May 30, 2003, which is now U.S. Pat. No. 6,770,907.

FIELD OF THE INVENTION

The present invention relates to the field of stress-induced defect detection in semiconductor devices; more specifically, it relates to a system of devices and test methodologies for detecting stress-induced defects and to the use of particular of these devices as antifuses.

BACKGROUND OF THE INVENTION

The fabrication processes for silicon chips often lead to the formation of small stress-induced silicon defects that may coalesce into dislocations or stacking faults that degrade the product functionality, yield and reliability. Examples of such processes include ion implantation, trench isolation and other dielectric isolation processes, trench capacitor processes, oxidation processes in general and film deposition processes. Results of stress-induced defects include gate and capacitor dielectric leakage, which may be yield or reliability defects.

Semiconductor silicon substrates, being crystalline are subject to shearing of one portion of the crystal with respect to another portion of the crystal along a specific crystal plane. Dislocations, which are postulated as crystalline defects, occur in different types including: edge dislocations, screw dislocations and declinations.

In dynamic random access memory (DRAM) technologies employing deep trench storage capacitors, the leakage requirements for the capacitor are very stringent, and monitor systems are introduced for the detection of process induced defects in the active area of the DRAM deep trench storage capacitors.

While methods exists for monitoring processes for defects and other methods exist for detecting stress during processes development, an efficient and sensitive monitoring systems for detecting stress-induced defects that could be used for both development and routine monitoring in manufacturing is limited. Therefore, a method is needed to detect the formation of silicon defects that is sensitive, simple, applicable to process monitoring and process development and applicable to logic and DRAM technologies.

SUMMARY OF THE INVENTION

A first aspect of the present invention is a method for detecting semiconductor process stress-induced defects comprising: providing a polysilicon-bounded test diode, the polysilicon-bounded test diode comprising a diffused first region within an upper portion of a second region of a silicon substrate, the second region of an opposite dopant type from the diffused first region, the diffused first region surrounded by a peripheral dielectric isolation and a peripheral polysilicon gate comprising a polysilicon layer over a dielectric layer and the polysilicon gate overlapping a peripheral portion of the diffused first region; stressing the polysilicon-bounded test diode; and monitoring the stressed polysilicon-bounded test diode for spikes in gate current during the stress.

A second aspect of the present invention is a method for detecting semiconductor process stress-induced defects comprising: providing one or more polysilicon-bounded test diodes, each polysilicon-bounded test diodes comprising a diffused first region within an upper portion of a second region of a silicon substrate, the second region of an opposite dopant type from the diffused first region, the diffused first region surrounded by a peripheral dielectric isolation and a peripheral polysilicon gate comprising a polysilicon layer over a dielectric layer, the polysilicon gate overlapping a peripheral portion of the diffused first region; stressing each the polysilicon-bounded test diode; measuring during the stressing for each the polysilicon-bounded test diode, the current through the first region as a function of a forward bias voltage applied between the first and second regions at at least a predetermined forward bias voltage; and determining the frequency distribution of the slope of the forward bias voltage versus the first region current at the pre-selected forward bias voltage for the one or more polysilicon-bounded test diodes.

A third aspect of the present invention is a method for detecting semiconductor process stress-induced defects comprising: providing one or more polysilicon-bounded test diodes, each polysilicon-bounded test diode comprising a diffused first region within an upper portion of a second region of a silicon substrate, the second region of an opposite dopant type from the diffused first region, the diffused first region surrounded by a peripheral dielectric isolation, a peripheral polysilicon gate comprising a polysilicon layer over a dielectric layer, the polysilicon gate overlapping a peripheral portion of the diffused first region; stressing each the polysilicon-bounded test diode for a pre-determined amount of time; and monitoring, after the stressing, each the polysilicon-bounded test diode for soft breakdown.

A fourth aspect of the present invention is a method for detecting semiconductor process stress-induced defects comprising: providing a test DRAM, the test DRAM having a transfer device comprising a channel region between first and second P+ regions formed in a N-well in a silicon substrate and a gate formed over the channel region, the second P+ region electrically connected to a conductive core of a deep trench capacitor, the substrate acting as a second plate of the deep trench capacitor; stressing the test DRAM; and monitoring the stressed test DRAM for spikes in first P+ region current during the stressing.

A fifth aspect of the present invention is a method for detecting semiconductor process stress-induced defects comprising: providing a test DRAM, the test DRAM having a transfer device comprising a channel region between first and second P+ regions formed in a N-well in a silicon substrate and a gate formed over the channel region, the second P+ region electrically connected to a conductive core of a deep trench capacitor, the substrate acting as a second plate of the deep trench capacitor; stressing the test DRAM; and monitoring the stressed test DRAM for spikes in gate current during the stressing.

A sixth aspect of the present invention is a method for detecting semiconductor process stress-induced defects comprising: providing a test DRAM, the test DRAM comprising a transfer device comprising a channel region between first and second P+ regions formed in a N-well in a silicon substrate and a gate formed over the channel region, the second P+ region electrically connected to a conductive core of a deep trench capacitor, the substrate acting as a second plate of the deep trench capacitor; stressing each the test DRAM; measuring during the stressing, for the test DRAM, the current through the first P+ region as a function of a forward bias voltage applied between the first P+ region and the N-well at at least a pre-selected forward bias voltage; and determining the frequency distribution of the slope of the forward bias voltage versus the first P+ region current at the pre-selected forward bias voltage for the one or more test DRAMs.

A seventh aspect of the present invention is a method for detecting semiconductor process stress-induced defects comprising: providing a test DRAM, the test DRAM comprising a transfer device comprising a channel region between first and second P+ regions formed in a N-well in a silicon substrate and a gate formed over the channel region, the second P+ region electrically connected to a conductive core of a deep trench capacitor, the substrate acting as a second plate of the deep trench capacitor; stressing the test DRAM for a pre-determined amount of time; and monitoring, after the stressing, each the test DRAM for soft breakdown.

An eighth aspect of the present invention is a method of fabricating an antifuse comprising: providing a silicon substrate having a surface; forming a ring of shallow trench isolation having an inner and an outer perimeter in the substrate extending from the surface of the substrate into the substrate; forming a polysilicon gate overlapping the inner perimeter of the shallow trench isolation on the surface of the substrate, the polysilicon gate comprising a dielectric layer between the surface of the substrate and a polysilicon layer, the polysilicon gate having an inner and outer perimeter; damaging the dielectric layer in a region along the inner perimeter of the polysilicon gate with a heavy ion specie implant to lower the breakdown voltage of the damaged dielectric layer in the region compared to the breakdown voltage in undamaged dielectric regions; and forming a diffused region in the silicon substrate within the inner perimeter of the shallow trench isolation, the diffused region extending from the surface of the substrate into the substrate a depth not exceeding a depth of the shallow trench isolation.

A ninth aspect of the present invention is an antifuse comprising: a silicon substrate having a surface; a ring of shallow trench isolation having an inner an outer perimeter in the substrate extending from the surface of the substrate into the substrate; a polysilicon gate overlapping the inner edge of the shallow trench isolation on the surface of the substrate, the polysilicon gate comprising a dielectric layer between the surface of the substrate and a polysilicon layer, the polysilicon gate having an inner and outer perimeter; a damaged region of the dielectric layer, the damaged region along the inner perimeter of the polysilicon gate, the damaged region damaged with a heavy ion specie implant and having a lower breakdown voltage than undamaged regions of the dielectric layer; and a diffused region in the silicon substrate within the inner perimeter of the shallow trench isolation, the diffused region extending from the surface of the substrate into the substrate a depth not exceeding a depth of the shallow trench isolation.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 15A through 15K are partial cross-sectional views illustrating fabrication of an antifuse according to the present invention;

DETAILED DESCRIPTION OF THE INVENTION

In the following description of the present invention the term stress-induced defect when used in conjunction with silicon substrates is intended to mean dislocations, stacking faults and other silicon crystal plane defects.

Figure 1:
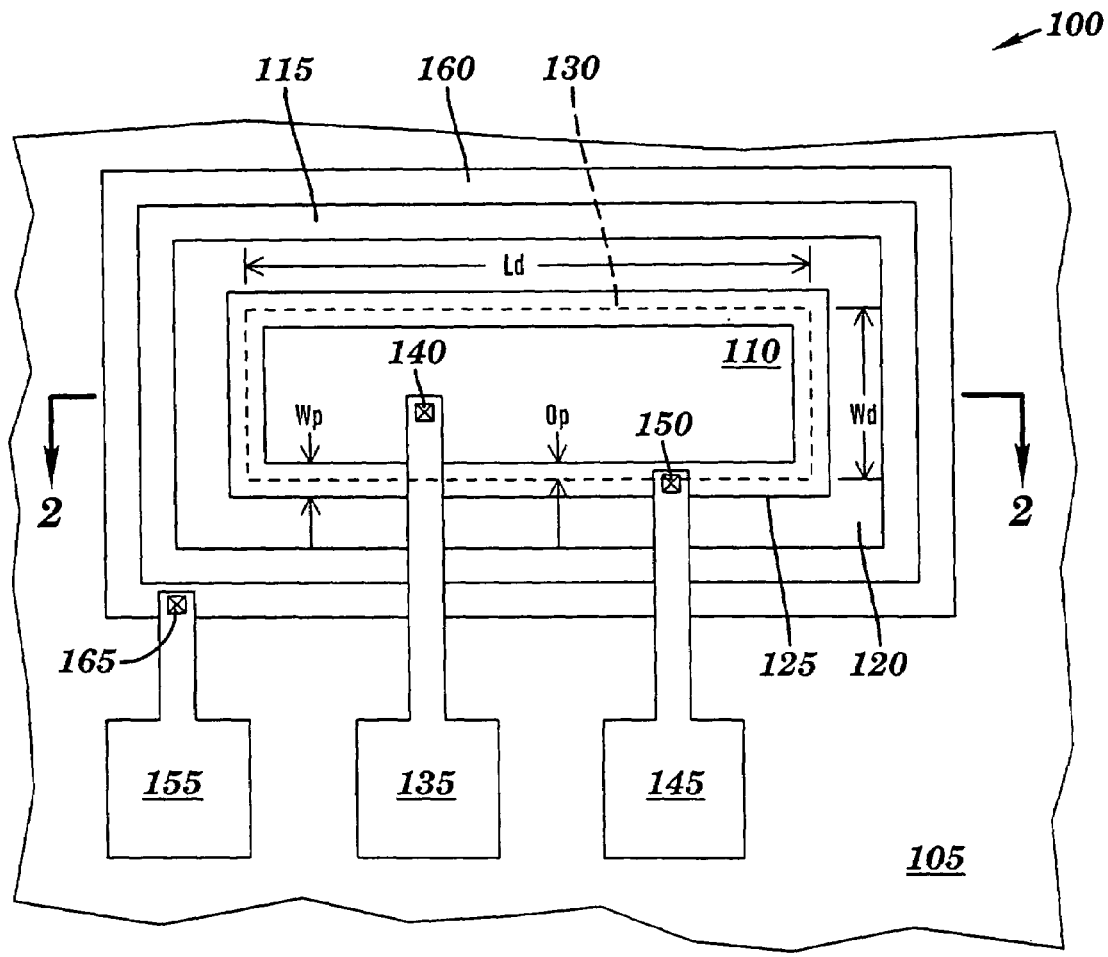
FIG. 1 is a top view of a polysilicon-bounded test diode for use in a test system for detecting and monitoring stress-induced defects in semiconductor devices according to the present invention.

FIG. 1 is a top view of a polysilicon-bounded test diode for use in a test system for detecting and monitoring stress-induced defects in semiconductor devices according to the present invention. In FIG. 1, polysilicon-bounded test diode 100 is formed in a silicon substrate 105.

Polysilicon-bounded test-diode 100 includes a P+ diffusion region 110 having a length "$L_D$" and a width "$W_D$" formed over an N-well region 115. P+ diffusion region 110 is bounded by a peripheral shallow trench isolation (STI) region 120. A peripheral polysilicon gate 125 overlaps the entire STI/P+ diffusion region interface 130 giving polysilicon-bounded test diode 100 a high perimeter to area ratio. Polysilicon gate 125 has a width "$W_P$" and overlaps P+ diffusion region 110 by a distance "$O_P$." Polysilicon-bounded test diode 100 also includes a first probe pad 135 electrically connected to P+ diffusion region 110 by a first contact 140, a second probe pad 145 electrically connected to polysilicon gate 125 by a second contact 150 and a third probe pad 155 connected to an N+ diffusion region 160 by a third contact 165. N+ diffusion region 160 provides low resistance electrical connection to N-well 115. Both STI 120 and N+ diffusion region 160 are formed in the shapes of rings, the N+ diffusion region surrounding the STI.

Figure 2:
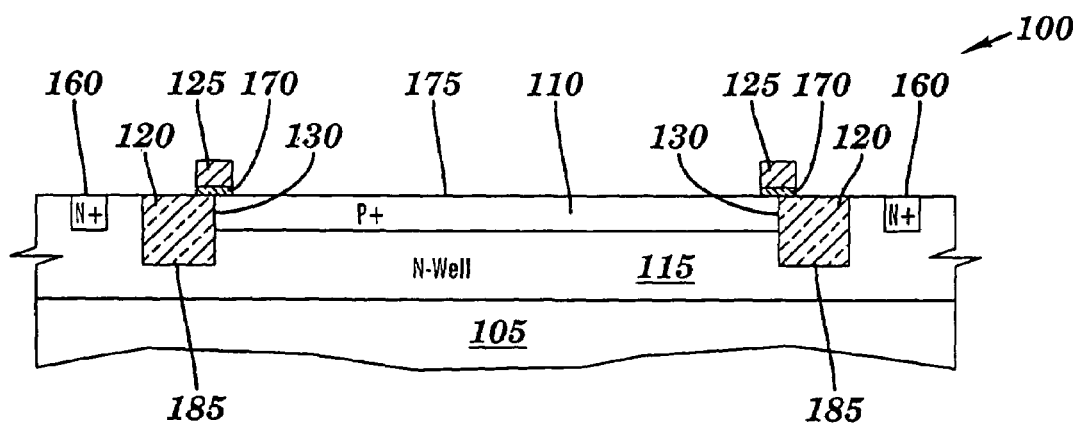
FIG. 2 is a partial cross-sectional view through 2—2 of the polysilicon-bounded test diode of FIG. 1 according to the present invention.

FIG. 2 is a partial cross-sectional view through 2—2 of the polysilicon-bounded test diode of FIG. 1 according to the present invention. In FIG. 2, polysilicon gate 125 includes a dielectric layer 170 formed on a top surface 175 of silicon substrate 105 and a polysilicon layer formed on top of the gate dielectric layer. P+ diffusion region 110 does not extend below a bottom surface 185 of STI 120. Also, the overlap of polysilicon gate 125 of STI 120 and P+ diffusion region 110 is clearly illustrated.

In one example, "$L_D$" is about 50 to 500 microns, "$W_D$" is about 2 to 10 microns, "$W_P$" is about 0.5 to 1.5 microns and "$O_P$" is about 0.1 to 0.6 microns. Gate dielectric layer 170 may be thermal oxide about 1 to 10 nm thick.

The lower limit of "$L_D$" is chosen so as not to impact the sensitivity of the measurement to be performed and the upper limit is constrained by silicon real estate concerns. That is, large devices consume valuable silicon area and small devices are subject to noise. The lower limit of "$W_P$" is limited by technology ground rules and process equipment limitations (i.e. photolithography and etching.) The upper limit must be high enough to provide low noise to signal ratios for the measurement being performed, narrow devices being noisier than wider devices. The upper and lower limits of "$O_P$" are primarily driven by technology ground rules and process equipment limitations.

Polysilicon-bounded diode 100 comprises a first portion of a defect test system, the test device. A second portion of the defect test system comprises a control or calibration device and is illustrated in FIGS. 3 and 4 and described below.

Figure 3:
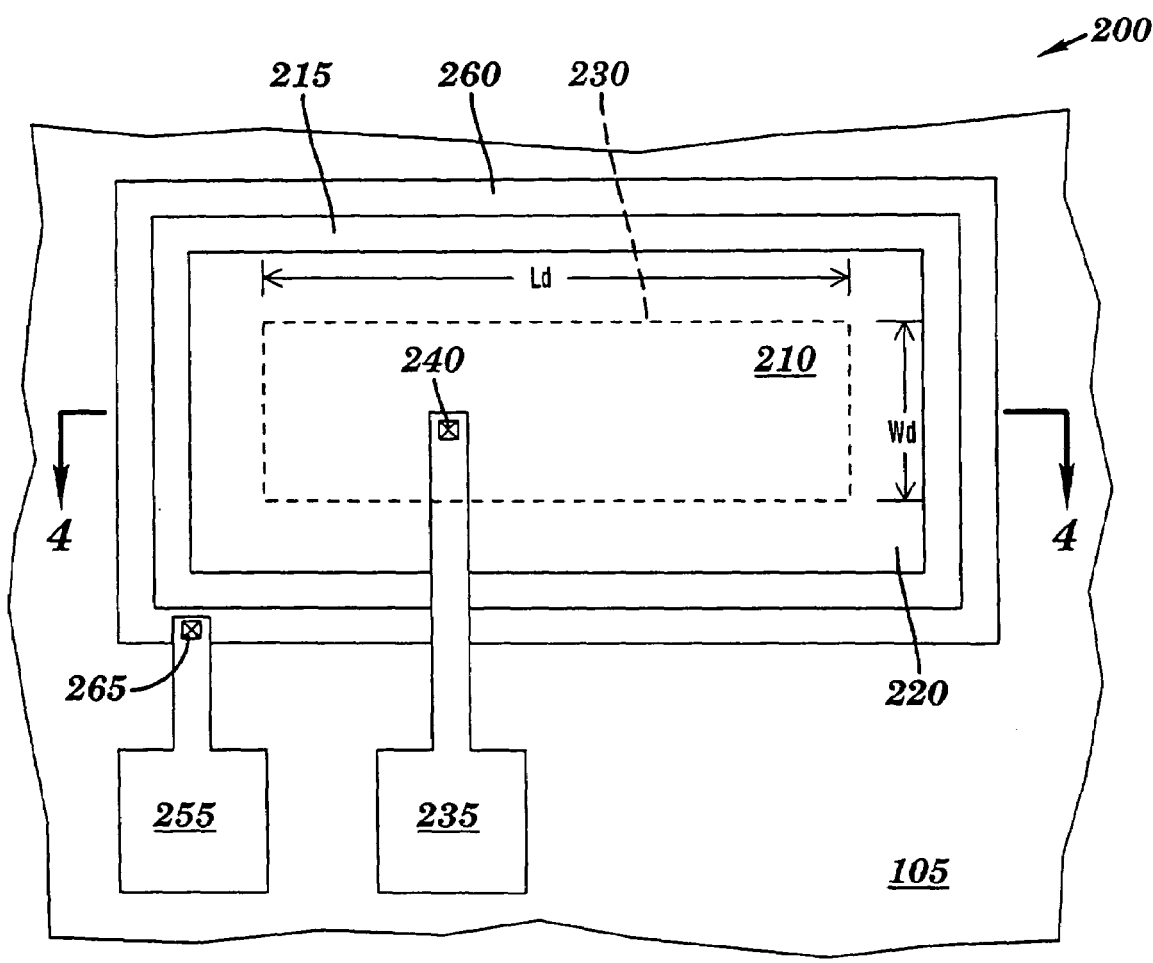
FIG. 3 is a top view of a STI-bounded reference diode for use in a test system in conjunction with the polysilicon-bounded test diode of FIG. 1, for detecting and monitoring stress-induced defects in semiconductor devices, according to the present invention.

FIG. 3 is a top view of a STI-bounded reference diode for use in a test system in conjunction with the polysilicon-bounded test diode of FIG. 1, for detecting and monitoring stress-induced defects in semiconductor devices, according to the present invention. In FIG. 3, STI-bounded reference diode 200 is formed in silicon substrate 105. STI-bounded reference diode 200 includes a P+ diffusion region 210 having a length "$L_D$" and a width "$W_D$" formed over N-well region 215. P+ diffusion region 210 is bounded by a peripheral STI 220. STI-bounded reference diode 200 has a high perimeter to area ratio. STI-bounded reference diode 200 also includes a first probe pad 235 electrically connected to P+ diffusion region 210 by a first contact 240 and a second probe pad 255 connected to an N+ diffusion region 260 by a second contact 265. N+ diffusion region 260 provides low resistance electrical connection to N-well 215. Both STI 220 and N+ diffusion region 260 are formed in the shapes of rings, the N+ diffusion region surrounding the STI.

Figure 4:
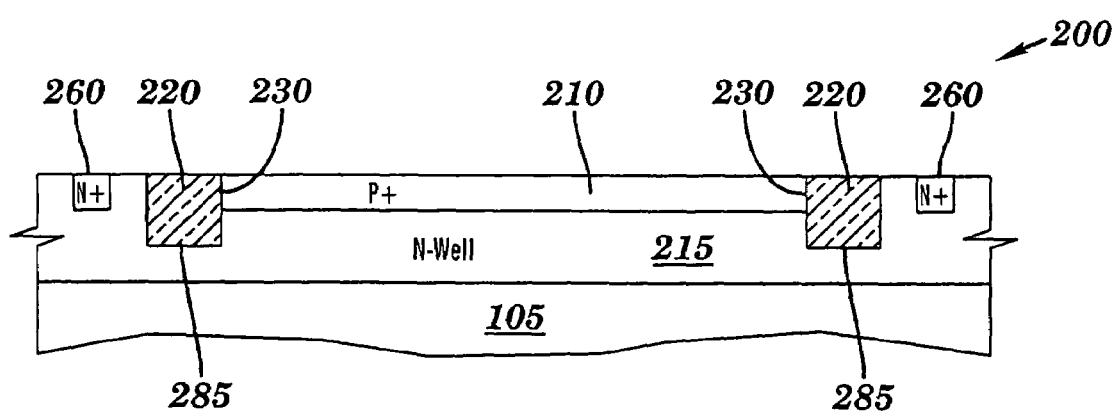
FIG. 4 is a partial cross-sectional view through 4—4 of the STI-bounded reference diode of FIG. 3 according to the present invention.

FIG. 4 is a partial cross-sectional view through 4—4 of the STI-bounded reference diode of FIG. 3 according to the present invention. In FIG. 4, P+ diffusion region 210 does not extend below a bottom surface 285 of STI 220.

In one example, "$L_D$" is about 50 to 500 microns and "$W_D$" is about 2 to 10 microns. In practice, "$L_D$" and "$W_P$" of polysilicon-bounded test diode 100 would be the same as the "$L_D$" and $W_P$" of STI-bounded reference diode 200. If more than one size of polysilicon-bounded test diode 100 is used, then corresponding sizes of STI-bounded reference diode 200 are used. Both polysilicon-bounded test diode 100 and STI-bounded reference diode 200 are fabricated simultaneously and the STI, N-well, P+ diffusion and N+ diffusion processes would be common to both devices.

For both polysilicon-bounded test diode 100 and STI-bounded reference diode 200 reverse polarity diodes may be used. P+ diffusion regions would be replaced by N+ diffusions, N+ diffusions by P+ diffusions and N-well by P-well. While STI technology has been illustrated other types of isolation such as local oxidation of silicon (LOCOS.)

The test and reference structures of the first embodiment of the present invention are suitable for both testing both Logic devices/processes using complimentary metal-oxide-silicon (CMOS) and DRAM technologies. The test and reference structures of the second embodiment are more suited to testing DRAM technology devices/processes and are illustrated in FIGS. 5 and 6 and described below.

Figure 5:
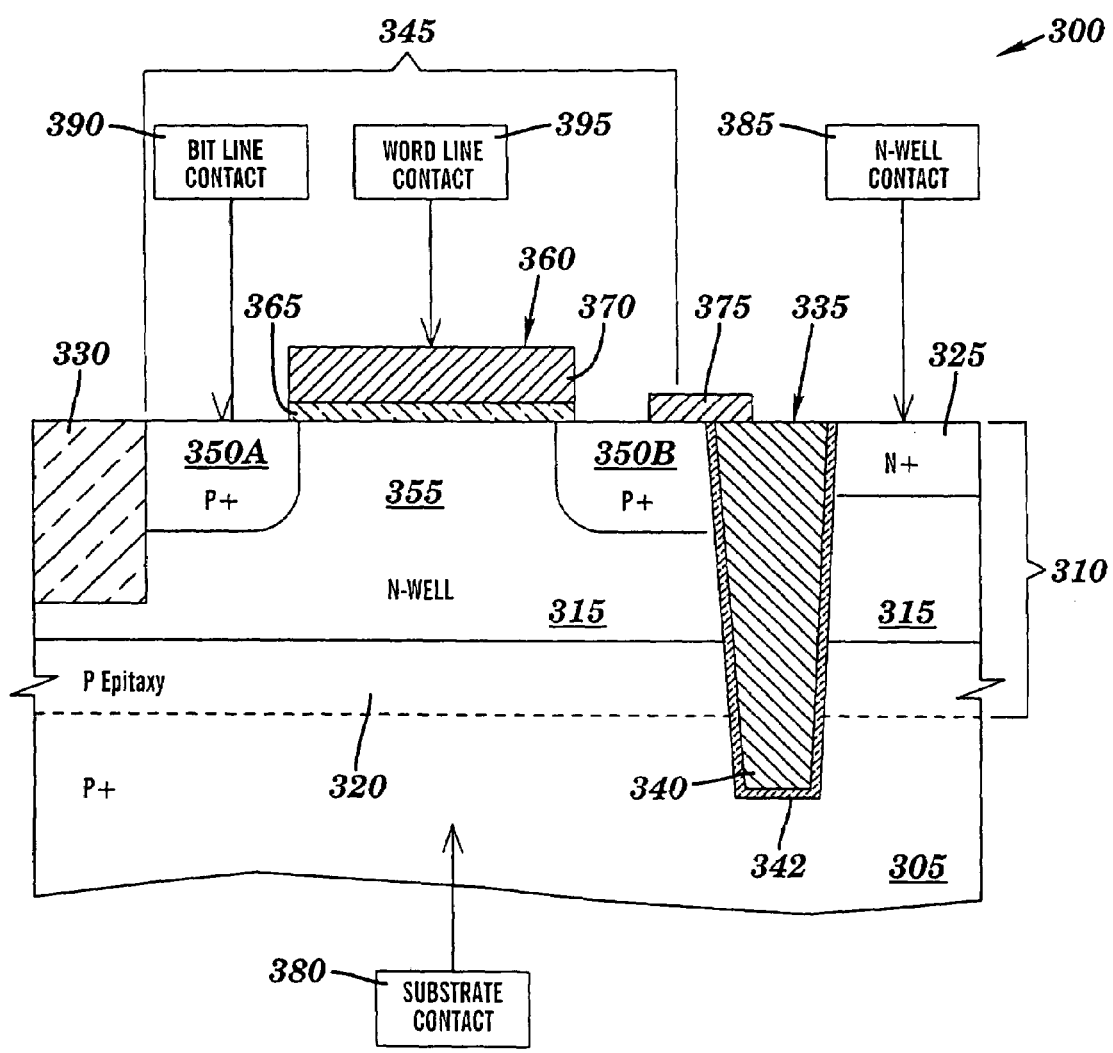
FIG. 5 is a partial cross-sectional view of a test DRAM device adapted for use in a test system for detecting and monitoring stress-induced defects in semiconductor devices to the present invention.
Figure 6:
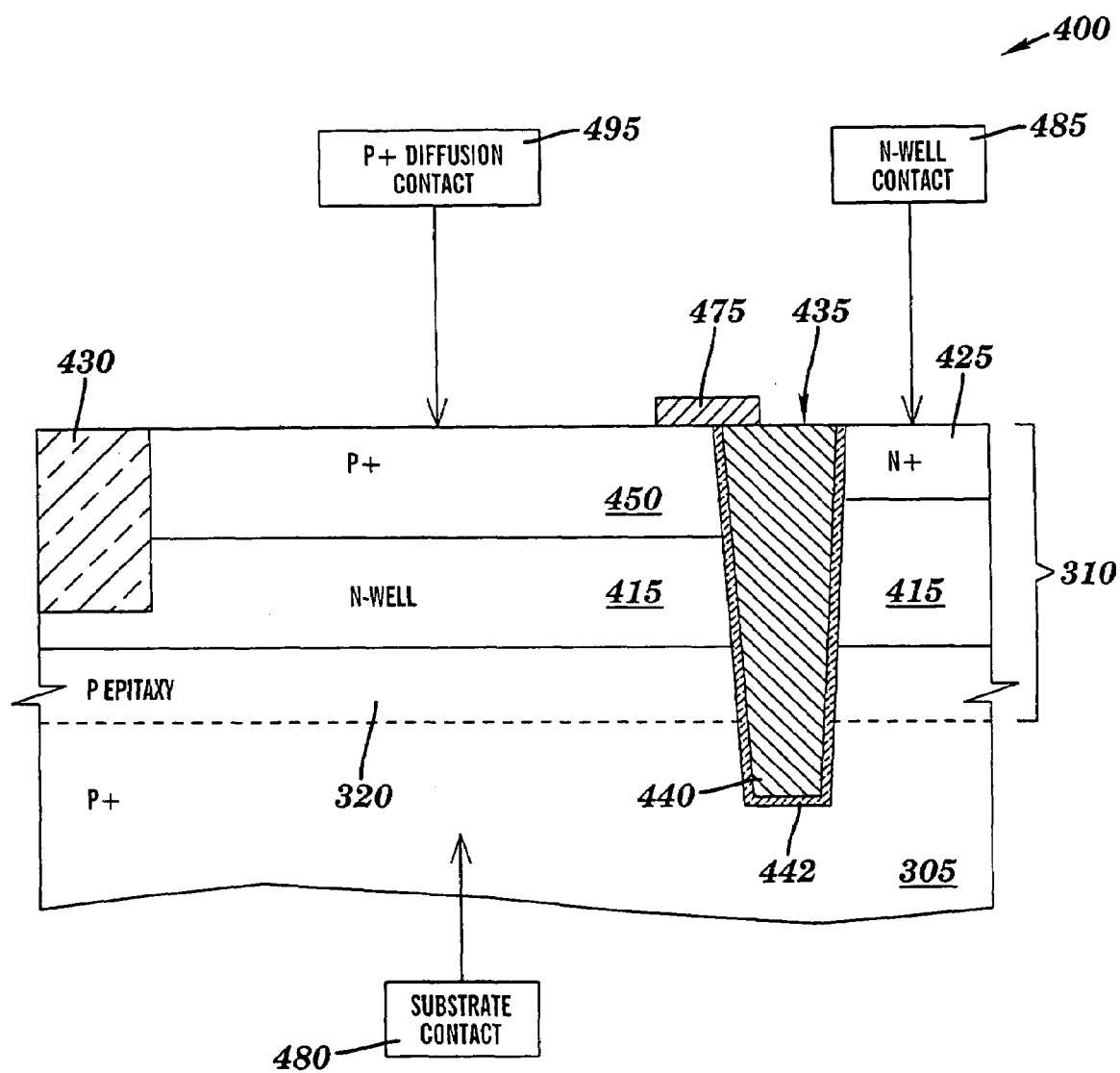
FIG. 6 is a partial cross-sectional view of a reference device adapted for use in a test system in conjunction with the test DRAM of FIG. 5, for detecting and monitoring stress-induced defects in semiconductor devices, according to the present invention.

FIG. 5 is a partial cross-sectional view of a test DRAM device adapted for use in a test system for detecting and monitoring stress-induced defects in semiconductor devices according to the present invention. In FIG. 5, a test DRAM device 300 is formed in a P+ silicon substrate 305 and in a P⁻ epitaxial layer 310 grown on the P+ silicon substrate. Formed in P⁻ epitaxial layer 310 is a N-well 315. A P⁻ region 320 of P⁻ epitaxial layer 310 remains P type doped between N-well 315 and P+ substrate 305. An N+ diffusion 325 provides low resistance electrical connection to N-well 315. Also formed in N-well 315 is STI 330. STI 330 does not extend into P⁻ region 320. Further formed in N-well 315 is a deep trench capacitor 335. Deep trench capacitor 335 extends through N-well 315, P⁻ region 320 and into P+substrate 305. Deep trench capacitor 335 comprises a polysilicon core 340 surrounded by a dielectric liner 342. Formed in N-well 315, between STI 330 and deep trench capacitor 335 is a PFET transfer device 345. PFET transfer device 345 comprises a first P+ diffusion 350A adjacent to STI 330, a second P+ diffusion region 350B adjacent to deep trench capacitor 335, channel region 355 and a polysilicon gate 360. First P+ diffusion 350A and second P+ diffusion 350B are separated by a channel region 355 of N-well 315. Polysilicon gate 360 is formed over channel region 355 and aligned to first and second P+ diffusions 350A and 350B. Polysilicon gate 360 comprises a gate dielectric portion 365 formed over channel region 355 and a polysilicon portion 370 formed on top of the gate dielectric portion. A metal strap 375 electrically connects deep trench capacitor 335 to second P+ diffusion 350B.

Schematically illustrated in FIG. 5 is a substrate contact 380 to P+ substrate 305, an N-well contact 385 to N+ diffusion 325, a bit-line contact 390 to first P+ diffusion 350A and a word line contact 395 to polysilicon gate 360.

Test DRAM device 300 comprises a first portion of a defect test system, the test device. A second portion of the defect test system comprises a control or calibration device and is illustrated in FIG. 6 and described below.

FIG. 6 is a partial cross-sectional view of a reference device adapted for use in a test system in conjunction with the test DRAM of FIG. 5, for detecting and monitoring stress-induced defects in semiconductor devices, according to the present invention. In FIG. 6, a reference device 400 is formed in a P+ silicon substrate 305 and in a P⁻ epitaxial layer 310 grown on the P+ silicon substrate. Formed in P⁻ epitaxial layer 310 is an N-well 415. A P⁻ region 320 of P⁻ epitaxial layer 310 remains P type doped between N-well 415 and P+ substrate 305. An N+ diffusion 425 provides low resistance electrical connection to N-well 415. Also formed in N-well 415 is STI 430. STI 430 does not extend into P⁻ region 320. Further formed in N-well 415 is a deep trench capacitor 435. Deep trench capacitor 435 extends through N-well 415, P⁻ region 320 and into P+ substrate 305. Deep trench capacitor 435 comprises a polysilicon core 440 surrounded by a dielectric liner 442. Formed in N-well 415, between STI 430 and deep trench capacitor 435 is a P+ diffusion 450. A metal strap 475 electrically connects deep trench capacitor 435 to P+ diffusion 450.

Schematically illustrated in FIG. 6 is a substrate contact 480 to P+ substrate 305, an N-well contact 485 to N+ diffusion 425 and a P+ diffusion contact 495 to P+ diffusion 450.

While a PFET transfer device has been illustrated for test DRAM device 300 and a P+ diffusion for reference device 400, the present invention is equally applicable to a test DRAM device using an NFET transfer device in conjunction with a reference device using a N+ diffusion.

When used for semiconductor process development or product testing and/or screening, multiplicities of polysilicon-bounded test diodes 100 with or without STI-bounded reference diodes 200 and/or test DRAM devices 300 with/or without reference devices 400 may, in one example, be formed in the kerf areas of chips on semiconductor wafers during chip fabrication and tested at appropriate points in the process. Sets of polysilicon-bounded test diodes 100, STI-bounded reference diodes 200 of varying dimension "$W_D$", "$L_D$", "$O_P$" and "$W_P$" may be used.

It should be noted that whenever a test methodology uses a test DRAM device 300 (see FIG. 5) the terms "bit line contact (390)" and "first P+ diffusion region (350A)" are interchangeable, the terms "word line contact (395)" and "gate (360)" are interchangeable, the terms "N-well contact (385)" and "N-well (315)" are interchangeable and the terms "substrate contact (380)" and "substrate (305)" are interchangeable.

It should be noted that whenever a test methodology uses a reference device 400 (see FIG. 6) the terms "P+ diffusion contact (495)" and "P+ diffusion (450)" are interchangeable and the terms "substrate contact (480)" and "substrate (305)" are interchangeable.

Figure 7A:
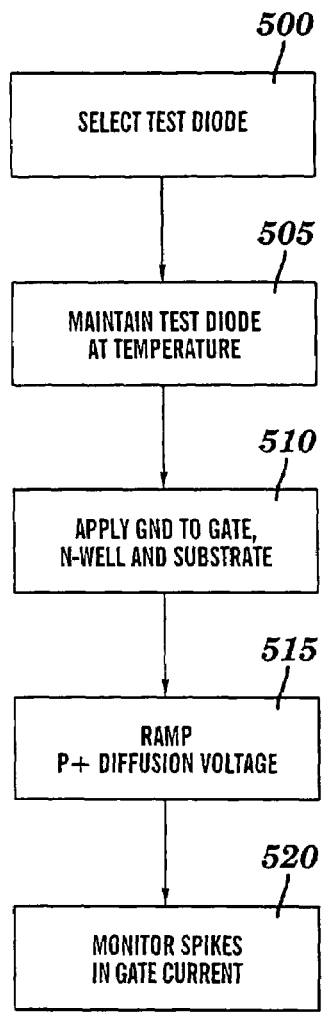
FIGS. 7A through 7C are flowcharts illustrating first, second and third test methodologies respectively, according to a first embodiment of the present invention.
Figure 7B:
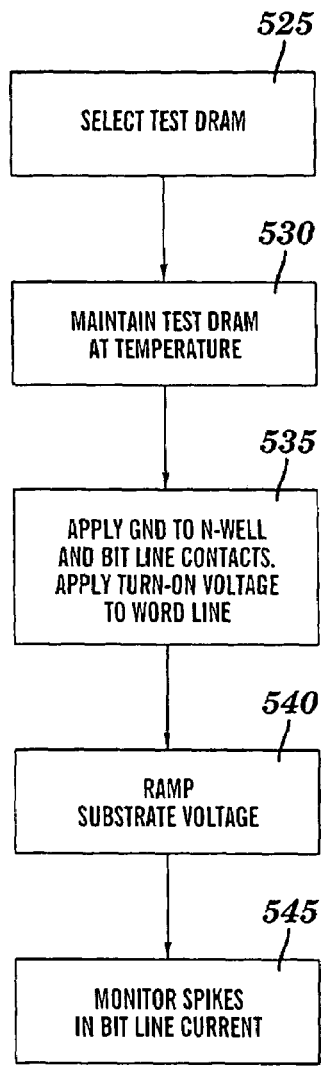
Figure 7C:
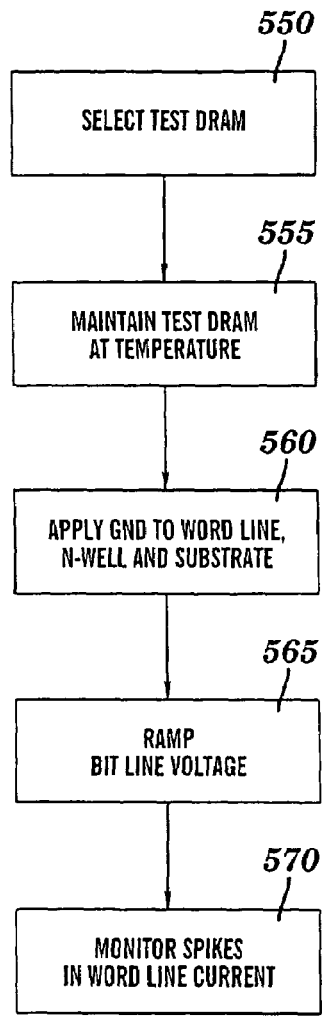

FIGS. 7A through 7C are flowcharts illustrating first, second and third test methodologies respectively, according to a first embodiment of the present invention. Referring to FIG. 7A, in step 500, a polysilicon-bounded test diode 100 (see FIGS. 1 and 2) is selected. In step 505, polysilicon-bounded test diode 100 is maintained at a pre-selected temperature. In one example, the pre-selected temperature is 180° C. However, any temperature in the range of about 100 to 200° C. may be used. In step 510, polysilicon gate 125, N-well 115 and substrate 105 (see FIG. 1) are held at ground potential. In one example, ground potential is about 0 volts. In step 515, P+ diffusion region 110 (see FIG. 1) is ramped from about 0 volts to about −6 volts. In step 520, the current through polysilicon gate 125 (see FIG. 1) is monitored for current spikes. An example is illustrated in FIGS. 8 and 9 and described below.

Referring to FIG. 7B, in step 525, a test DRAM device 300 (see FIG. 5) is selected. In step 530, test DRAM device 300 is maintained at a pre-selected temperature. In one example, the pre-selected temperature is 180° C. However, any temperature in the range of about 100 to 200° C. may be used. In step 535, N-well contact 385, and bit line contact 390 are held at ground potential and word line contact 395 is held at a voltage sufficient to turn on transfer device 345 (see FIG. 5) In one example, ground potential is about 0 volts and the turn on voltage is about −2 volts. In step 540, substrate contact 380 (see FIG. 5) is ramped from about 0 volts to about −6 volts. In step 545, the current through bit line contact 390 (see FIG. 5) is monitored for current spikes.

Referring to FIG. 7C, in step 550, a test DRAM device 300 (see FIG. 5) is selected. In step 555, test DRAM device 300 is maintained at a pre-selected temperature. In one example, the pre-selected temperature is 180° C. However, any temperature in the range of about 100 to 200° C. may be used. In step 560, N-well contact 385, by substrate contact 380 and wordline contact 395 (see FIG. 5) are held at ground potential. In one example, ground potential is about 0 volts. In step 565, bit line contact 390 (see FIG. 5) is ramped from about 0 volts to about −6 volts. In step 570, the current through word line contact 395 (see FIG. 5) is monitored for current spikes.

Figure 8:
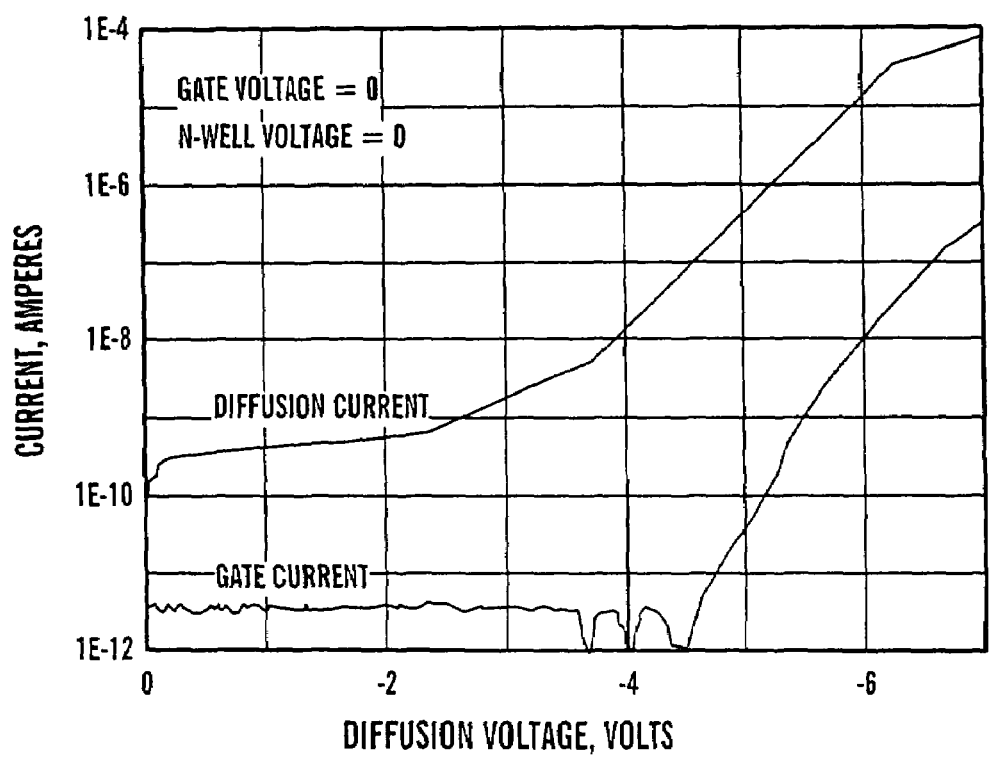
FIG. 8 is a plot of P+ diffusion and gate currents versus diffusion reverse bias voltage for the polysilicon-bounded test diode of FIG. 1 having no stress-induced defects.
Figure 9:
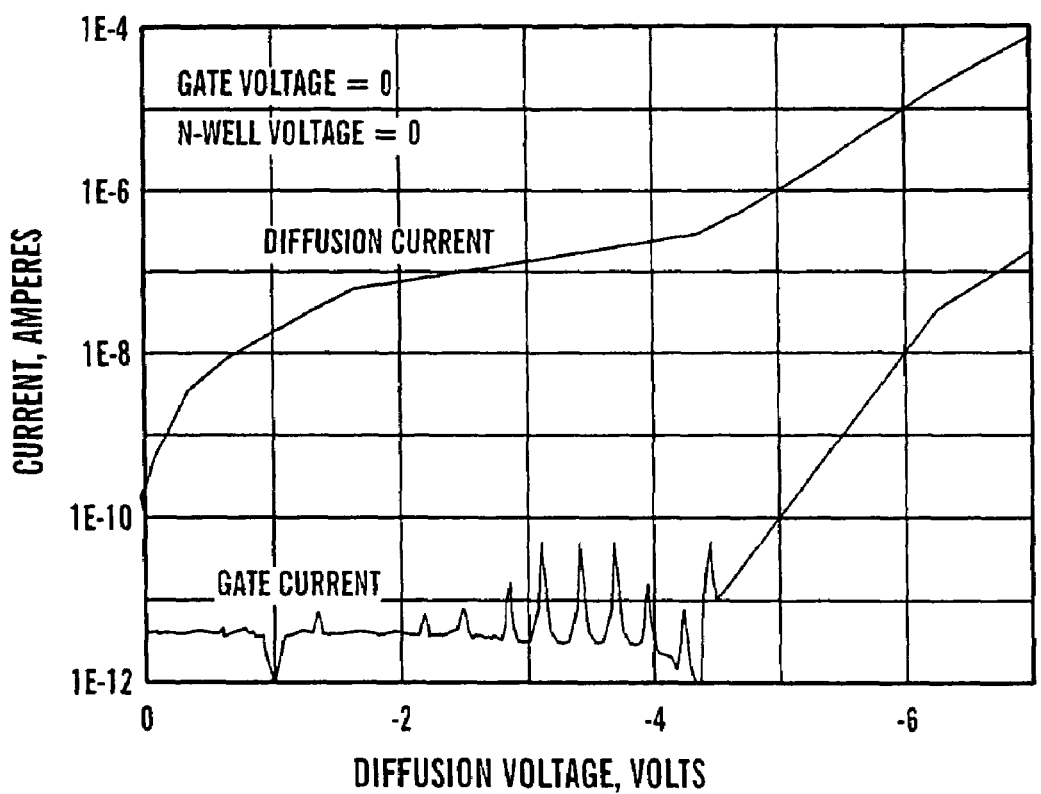
FIG. 9 is a plot of P+ diffusion and gate currents versus diffusion reverse bias voltage for the polysilicon-bounded test diode of FIG. 1 having stress-induced defects.

FIG. 8 is a plot of P+ diffusion and gate currents versus diffusion reverse bias voltage for the polysilicon-bounded test diode of FIG. 1 having no stress-induced defects and FIG. 9 is a plot of P+ diffusion and gate currents versus diffusion reverse bias voltage for the polysilicon-bounded test diode of FIG. 1 having stress-induced defects. While FIGS. 8 and 9 are for polysilicon-bounded test diodes having a gate dielectric of five nm of thermal oxide, similar plots would be obtained for the test DRAM device of FIG. 3.

It is clear from FIGS. 8 and 9, that the diffusion reverse bias leakage is higher for a polysilicon-bounded diode with stress-induced defects then for a polysilicon-bounded diode without stress-induced defects. Comparing FIGS. 8 and 9, it may be seen that the gate current for a polysilicon-bounded diode with stress-induced defects exhibits spiking or sudden increases by as much as ten times more than the background gate leakage, as the P+ diffusion reverse bias voltage is changed from 0 to about −4V. This behavior is not present for the polysilicon-bounded test diodes without stress-induced defects.

For reverse bias voltages more negative than −4 V, the gate current increases exponentially due to Fowler-Nordhein tunneling, and the gate current becomes more significant than the spiking due to the stress-induced defects. The spiking in gate current occurs because of carrier generation at the site of the stress-induced defects, which act as carrier-generation sites.

In the case of a test DRAM device, the processing of the deep trench could cause stress-induced defects to be generated in the P+ substrate very close to the outer surface of the thin insulator of the deep trench. Under the second test methodology the presence of stress-induced defects causes spiking in the current flowing through the thin insulator of the deep trench, which then flows from the polysilicon filling the deep trench, through the channel of the transfer device and can be measured at the diffusion terminal. Under the third test methodology, stress-induced defects in the N-well/P+ diffusion close to the thin gate dielectric of the transfer device are detected.

When polysilicon-bounded test diodes 100 and test DRAM devices 300 are used in testing for stress-induced defects under the first, second and third test methodologies, the screen or fail limit for gate current spiking due to presence of stress-induced defects is about a three times increase in gate current over the background value. This increase in gate current can be observed by any of several techniques known in the art, such as connecting an oscilloscope to the polysilicon gate terminal.

Figure 10A:
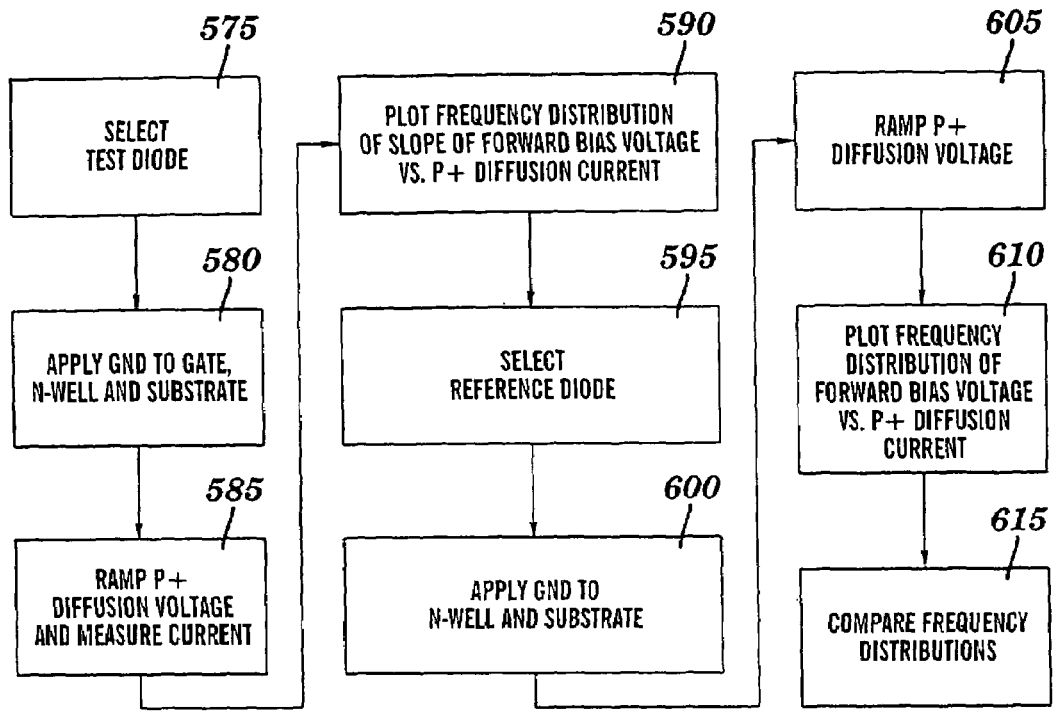
FIGS. 10A and 10B are flowcharts illustrating fourth and fifth test methodologies respectively according to a second embodiment of the present invention.
Figure 10B:
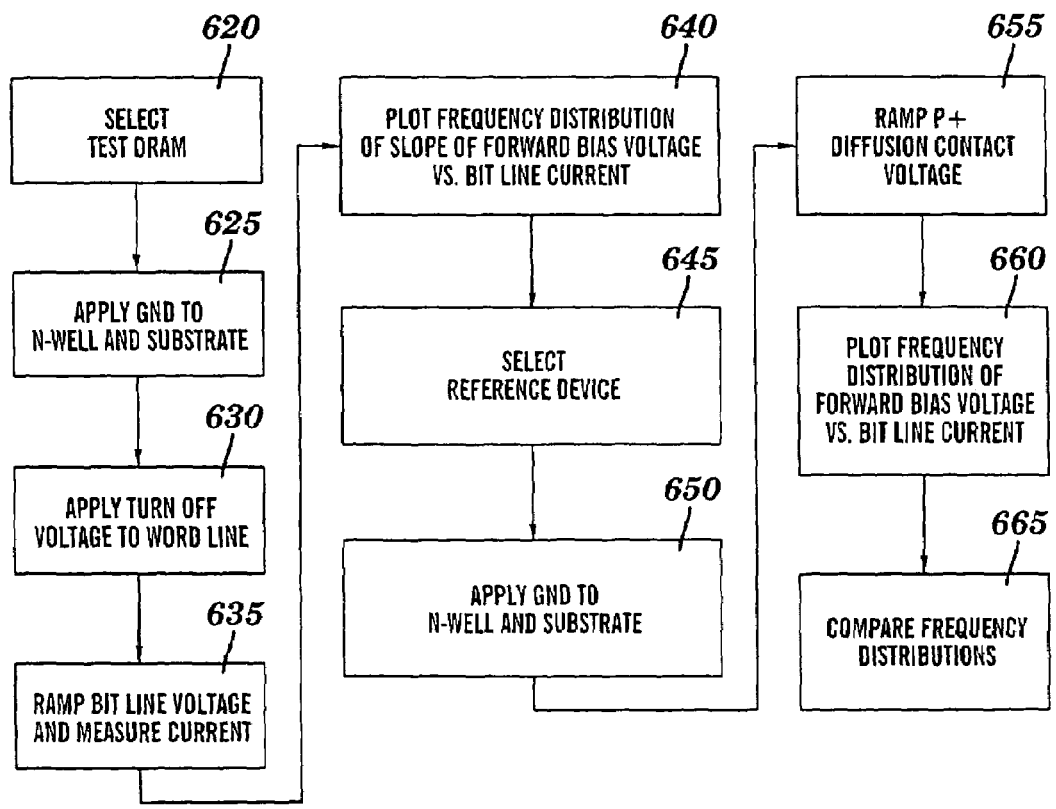

FIGS. 10A and 10B are flowcharts illustrating fourth and fifth test methodologies respectively, according to a second embodiment of the present invention. Referring to FIG. 10A, in step 575, one or more polysilicon-bounded test diodes 100 (see FIGS. 1 and 2) is selected. In step 580, for each polysilicon-bounded test diode 100, polysilicon gate 125, N-well 115 and substrate 105 (see FIG. 1) are held at ground potential. In one example, ground potential is about 0 volts. In step 585, for each polysilicon-bounded test diode 100, P+ diffusion region 110 (see FIG. 1) is ramped from about 0 volts to about 0.85 volts. In step 590, for each polysilicon-bounded test diode 100, the current through P+ diffusion region 110 (see FIG. 1) is measured as a function of voltage and a frequency distribution analysis of the slope of the forward bias voltage/P+ diffusion current at a pre-selected forward bias voltage is performed. In step 595, one or more STI-bounded reference diodes 200 (see FIGS. 3 and 4) is selected. In step 600, for each STI-bounded reference diode 200, N-well 215, and substrate 105 (see FIG. 3) are held at ground potential. In one example, ground potential is about 0 volts. In step 605, for each STI-bounded reference diode 200, P+ diffusion 210 (see FIG. 3) is ramped from about 0 volts to about 0.85 volts. In step 610, the current through P+ diffusion region 210 (see FIG. 3) is measured as a function of voltage and a frequency distribution analysis of the slope of forward bias voltage/P+ diffusion current at the pre-selected forward bias voltage is performed. In step 615, the frequency distributions of the slope of the forward bias voltage/P+ diffusion current at the pre-selected voltage value for polysilicon-bounded diodes 100 and STI-bounded reference diodes 200 are compared. An example forward bias voltage versus P+ diffusion current and of a frequency distribution analysis are illustrated in FIGS. 11 and 12 and described below.

Referring to FIG. 10B, in step 620, one or more test DRAM devices 300 (see FIG. 5) is selected. In step 625, for each test DRAM devices 300, N-well contact 385 and substrate contact 380 are held at ground potential and in step 630, word line contact 395 is held at a voltage sufficient to turn off transfer device 345 (see FIG. 5.) In one example, ground potential is about 0 volts and the turn off voltage is about 2 volts. In step 635, for each test DRAM devices 300, bit line contact 390 (see FIG. 5) is ramped from about 0 volts to about 0.85 volts. In step 640, for each test DRAM devices 300, the current through bit line contact 390 (see FIG. 5) is measured as a function of voltage and a frequency distribution analysis of the slope of forward bias voltage/bit line current at a pre-selected forward bias voltage is performed. In step 645, one or more reference devices 400 is selected.

In step 650, for each reference device 400, N-well contact 485 and substrate contacts 490 are held at ground potential. In one example, ground potential is about 0 volts. In step 655, for each reference device 400, P+ diffusion contact 495 (see FIG. 6) is ramped from about 0 volts to about 0.85 volts. In step 660, for each reference device 400, the current through P+ diffusion contact 495 (see FIG. 6) is measured as a function of voltage and a frequency distribution analysis of the slope of forward bias voltage/bit line current at the pre-selected forward bias voltage is performed. In step 665, the frequency distributions of the slope of the forward bias voltage/bit line current at the pre-selected voltage value for the test DRAM 300 and reference device 400 are compared.

Figure 11:
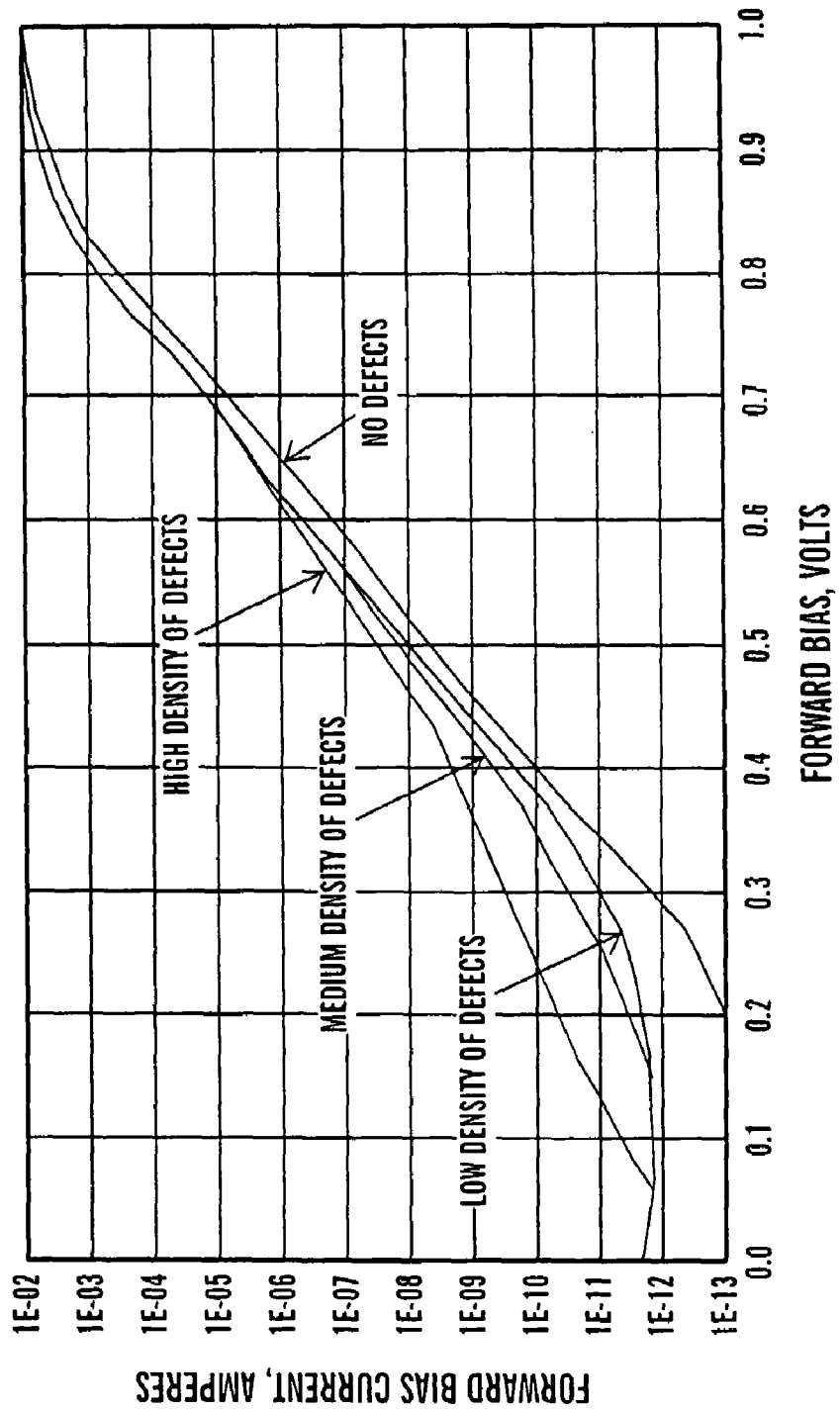
FIG. 11 is a plot of the forward bias current versus forward bias voltage for three different polysilicon-bounded test diodes of FIG. 1, each having different quantities of stress-induced defects.
Figure 12:
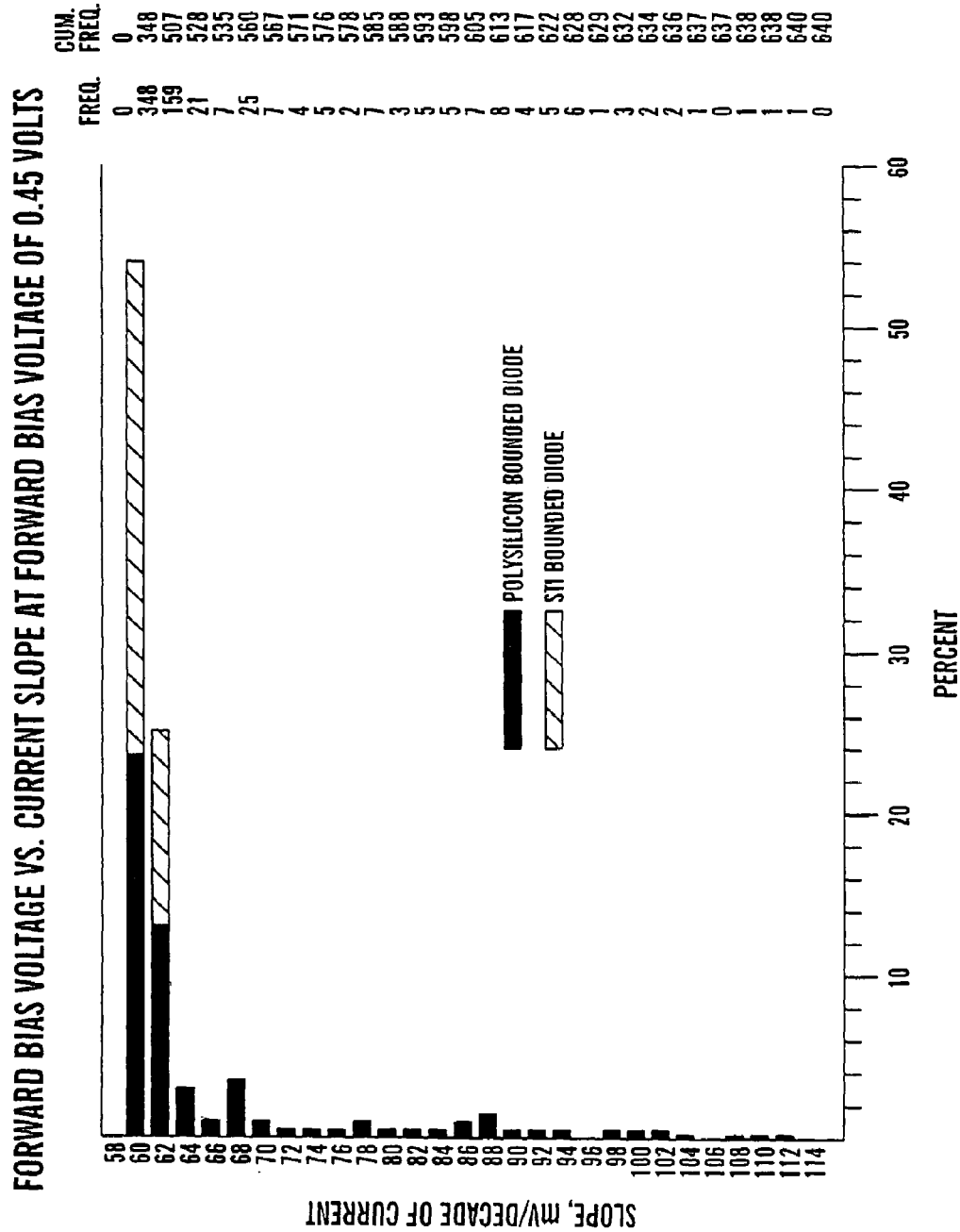
FIG. 12 is a histogram of the distribution of the slope, in mV/decade of current versus the forward bias current-voltage characteristics of polysilicon-bounded test diodes of FIG. 1 and STI-bounded reference diodes of FIG. 3.

FIG. 11 is a plot of the forward bias current versus forward bias voltage for three different polysilicon-bounded test diodes of FIG. 1, each having different quantities of stress-induced defects and FIG. 12 is a histogram of the distribution of the slope, in mV/decade of current versus the forward bias current voltage characteristics of polysilicon-bounded test diodes of FIG. 1 and STI-bounded reference diodes of FIG. 3. While FIGS. 11 and 12 are for polysilicon-bounded test diodes and STI-bounded reference diodes, similar plots would be obtained for the test DRAM device of FIG. 5 and the reference device of FIG. 6.

The forward bias slope of forward bias current versus bias voltage is defined by the amount of forward bias voltage/decade of diode current. This slope has a value of 59.4 mV/Decade at room temperature (27° C.) for a silicon diode without stress-induced defects. Using equation (1) the value of the forward bias slope may be calculated to be 59.4 mV/Decade at room temperature (27° C.)

$$S = Ln(10) \times KT/q \tag{1}$$

Where:
S is forward bias voltage/decade of diode current;
Ln is the natural logarithm;
K is Boltzmann's constant;
T is absolute temperature in degrees Kelvin; and
q is the electron charge.

Diodes with stress-induced defects show forward bias slopes higher than 59.4 mV/Decade. FIG. 11 indicates that the increase in the slope becomes more significant as the density of dislocations increases from none to low to high.

In FIG. 11, measurements on a set of polysilicon-bounded test diodes with no stress-induced defects, a low level of stress-induced defects, a medium level of stress-induced defects and a high level of stress-induced defects are plotted. The level of stress-induced defects was verified by transmission electron microscopy (TEM.)

FIG. 12 is a histogram of the distribution of the slope, in mV/decade of current versus the forward bias current-voltage characteristics of polysilicon-bounded test diodes of FIG. 1 and STI-bounded reference diodes of FIG. 3. In FIG. 12, the distribution of forward bias voltage versus current slopes is plotted as a histogram for one or more polysilicon-bounded test diodes and one or more STI-bounded reference diodes at a predetermined forward bias voltage (in this example, 0.45 volts.) STI-bounded reference diodes have no stress-induced defects (see below.) The dimensions for both polysilicon-bounded and STI-bounded diodes was, in this example, "$W_P$"=0.5 microns and "$L_D$"=of 100 microns (see FIG. 1.) FIG. 12 illustrates that for diodes with stress-induced defects, the forward bias versus current slopes at the pre-determined forward bias voltage have values well in excess of 59.4 mV/decade of current, reaching as high as 112 mV/decade of current.

When this test methodology is used for testing the screen or fail limit for the forward bias slope (at a pre-determined voltage), indicating presence of stress-induced defects may be set, in one example, at 64 mV/Decade, which is about 8% above the target value of 59.4 mV/decade for the forward bias slope of diodes without dislocations. This 8% tolerance allows for variations in measurement sensitivity.

Experiments performed with STI-bounded reference diodes, showed normal forward bias slope with no indication of stress-induced defects indicating STI-bounded reference diodes are suitable for use as control devices. The presence of stress-induced defects (in one example, dislocations) in polysilicon-bounded test diodes and lack of stress-induced defects (dislocations) in STI-bounded reference diodes was verified by transverse electron microscope (TEM) analysis. Determination of forward bias voltage versus current slope at about 0.4 to 0.5 volts of forward bias is optimum for this test methodology. Use of about 0.4 to 0.5 volts of forward bias voltage, with semiconductor stress-induced defects, results in the maximum increase in forward bias versus current slope with the presence of stress-induced defects, resulting in high sensitivity for the detection and characterization of stress-induced defects.

Figure 13A:
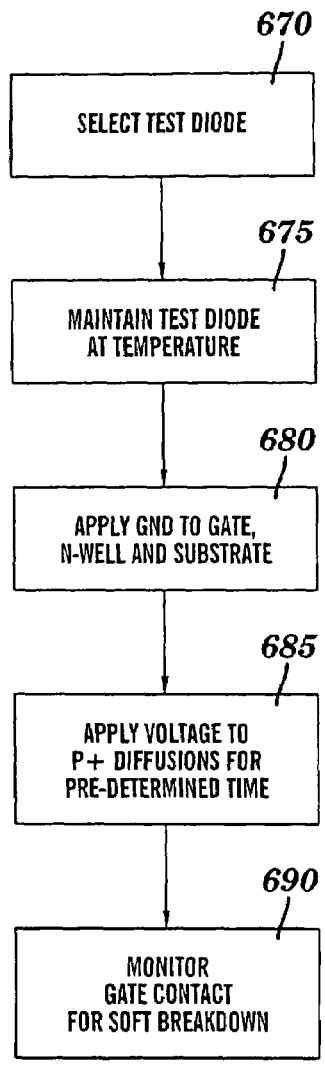
FIGS. 13A, 13B and 13C are flowcharts illustrating sixth, seventh and eighth test methodologies respectively, according to a third embodiment of the present invention.
Figure 13B:
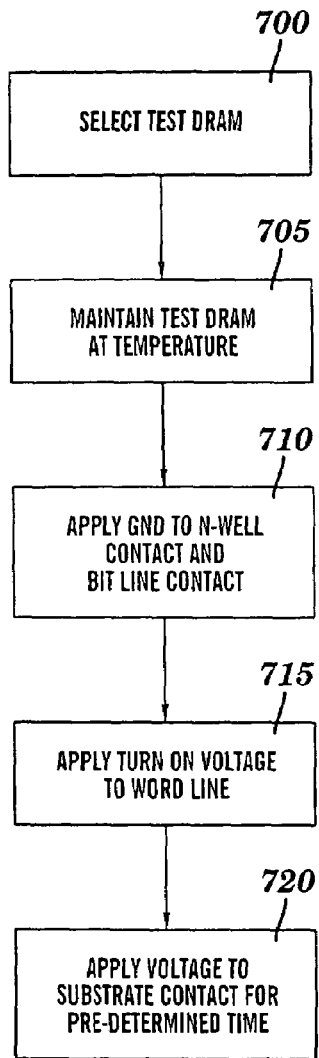
Figure 13C:
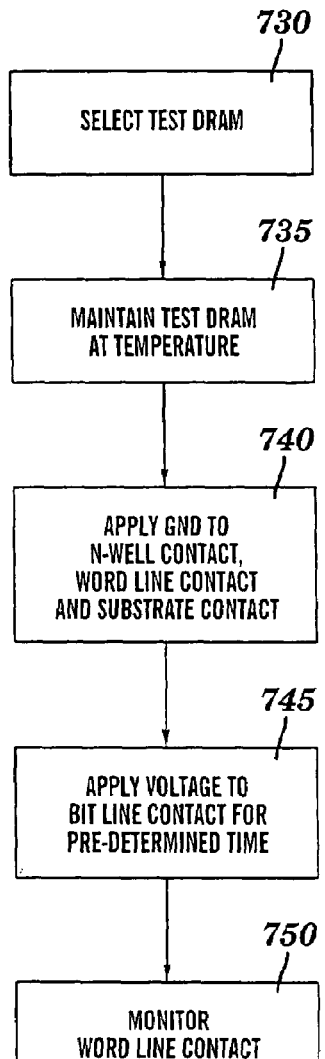

FIGS. 13A, 13B and 13C are flowcharts illustrating sixth, seventh and eighth test methodologies respectively, according to a third embodiment of the present invention. Referring to FIG. 13A, in step 670, one or more polysilicon-bounded test diodes 100 (see FIGS. 1 and 2) is selected. In step 675, each polysilicon-bounded test diode 100 is maintained at a pre-selected temperature. In one example, the pre-selected temperature is 160° C. However, any temperature in the range of about 100 to 200° C. may be used. In step 680, for each polysilicon-bounded test diode 100, N-well 115, substrate 105 and polysilicon gate 125 (see FIG. 1) are held at ground potential. In one example, ground potential is about 0 volts. In step 685, for each polysilicon-bounded test diode 100, a pre-determined voltage is applied to P+ diffusion region 110 (see FIG. 1) for at least a pre-determined time. In one example, the predetermined voltage is about −6.3 volts or less and the pre-determined time is about 0.5 hours or more. In step 690, for each polysilicon-bounded test diode 100, the current through polysilicon gate 125 (see FIG. 1) is monitored for "soft" breakdown.

"Soft" breakdown is defined as an increase in gate current of about 10 to 50 times the breakdown current of an unstressed gate. "Hard" breakdown is defined as an increase in gate current greater than about 50 times the breakdown current of an unstressed gate. (In the present example, −6.3 volts for 0.5 hours are the stress conditions.)

Referring to FIG. 13B, in step 700, one or more test DRAM devices 300 is selected. In step 705, each test DRAM device 300 is maintained at a pre-selected temperature. In one example, the pre-selected temperature is 160° C. However, any temperature in the range of about 100 to 200° C. may be used. In step 710, for each test DRAM device 300, N-well contact 385 and bit line contact 390 (see FIG. 5) are held at ground potential. In one example, ground potential is about 0 volts. In step 715, for each test DRAM device 300, word line contact 395 is held at a voltage sufficient to turn on transfer device 345 (see FIG. 5.) In step 720, for each test DRAM device 300, a pre-determined voltage is applied to substrate contact 380 (see FIG. 5) for at least a pre-determined time. In one example, the pre-determined voltage is about −5.0 volts or less and the pre-determined time is about 0.5 hours or more. In step 725, for each test DRAM device 300, the current through bit line contact 390 (see FIG. 5) is monitored for "soft" breakdown.

Referring to FIG. 13C, in step 730, one or more test DRAM devices 300 (see FIG. 5) is selected. In step 735, each test DRAM device 300 is maintained at a pre-selected temperature. In one example, the pre-selected temperature is 160° C. However, any temperature in the range of about 100 to 200° C. may be used. In step 740, for each test DRAM device 300, N-well contact 385, substrate contact 380 and word line contact 395 (see FIG. 5) are held at ground potential. In one example, ground potential is about 0 volts. In step 745, for each test DRAM device 300, a pre-determined voltage is applied to bit line contact 390 (see FIG. 5) for at least a pre-determined time. In one example, the predetermined voltage is about −6.3 volts or less and the pre-determined time is about 0.5 hours or more. In step 750, for each test DRAM device 300, the current through word line contact 395 (see FIG. 5) is monitored for "soft" breakdown.

Figure 14:
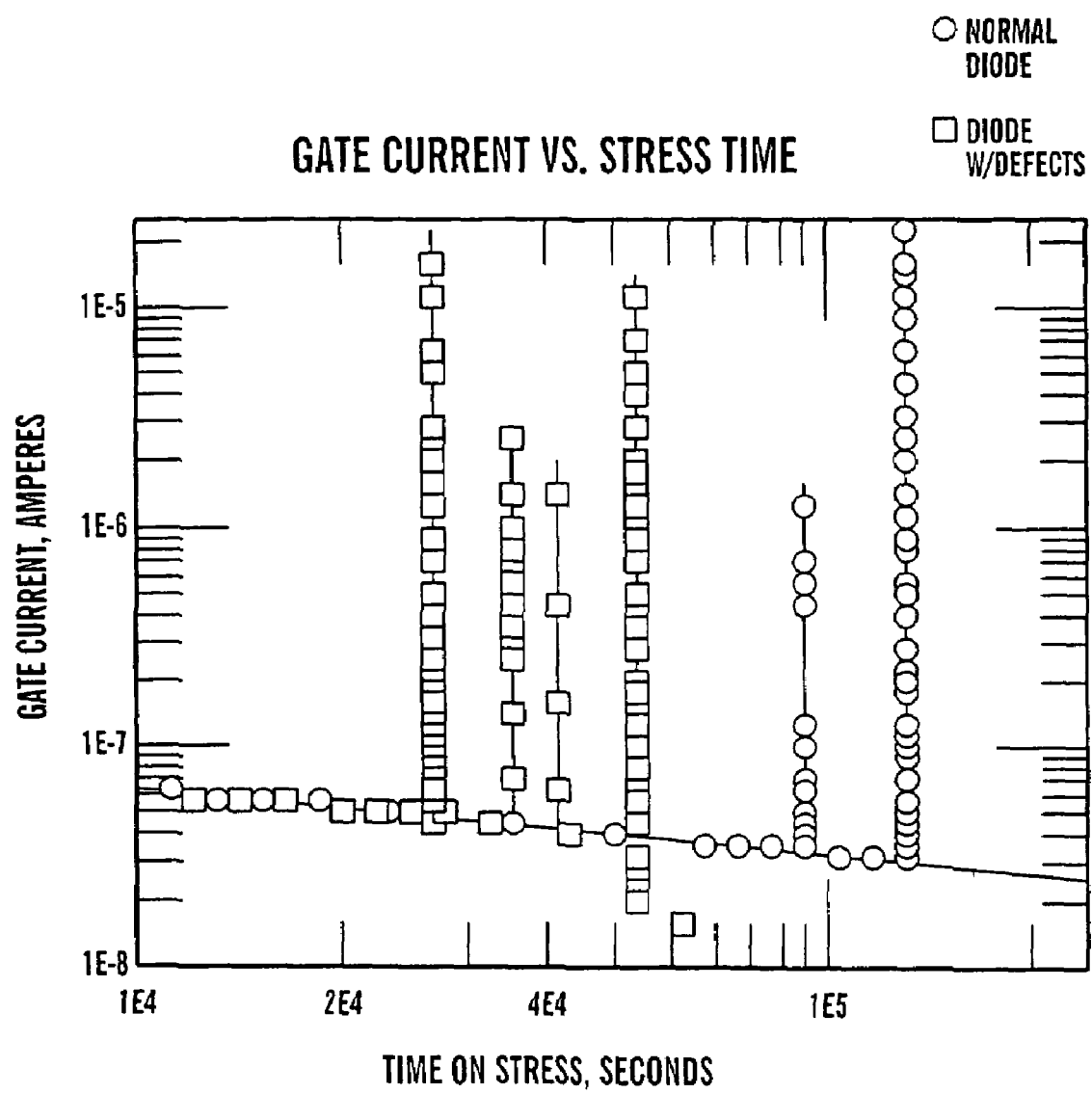
FIG. 14 is a plot of the polysilicon gate current versus stress time for polysilicon-bounded test diodes of FIG. 1 with and without stress-induced defects.

FIG. 14 is a plot of the polysilicon gate current versus stress time for polysilicon-bounded test diodes of FIG. 1 with and without stress-induced defects. The data plotted in FIG. 14 was obtained from a polysilicon-bounded test diode having 5 nm of thermal oxide gate dielectric. The stress conditions were −6.3 volts at 160° C. for about 1.5E5 seconds.

It may be readily seen from FIG. 14 that the gate current prior to breakdown (prior to about 2.8E4 seconds) is about the same for diodes with and without stress-induced defects. FIG. 14 clearly illustrates that polysilicon-bounded test diodes with stress-induced defects show earlier breakdown than polysilicon-bounded test diodes without stress-induced defects. The earlier gate breakdown in polysilicon-bounded test diodes having stress-induced defects is attributed to the stress-induced defects causing spikes in the gate current which in turn stresses the gate dielectric causing it to breakdown.

FIG. 14 also clearly illustrates polysilicon-bounded diodes with stress-induced defects exhibit "soft," limited, breakdown as defined above. In "hard" breakdown, the increase in gate current is limited only by the external circuit resistance, with almost no resistance contribution due to the gate oxide. While FIG. 14 is for polysilicon-bounded test diodes, similar plots would be obtained for the test DRAM device of FIG. 5.

The seventh test methodology (illustrated in FIG. 13B and described above) is particularly suited to detect stress-induced defects in the substrate near the deep trench capacitor. The eighth test methodology (illustrated in FIG. 13C and described above) is particularly suited to detect stress-induced defects in the P+ diffusion/N-well interface near the gate dielectric of the transfer device.

It should be noted that the optimization of the polysilicon-bounded test diode/STI-bounded reference diode test system for the detection and characterization of the semiconductor stress-induced defects is a strong function of the perimeter-to-area ratio of polysilicon gate 125 of polysilicon-bounded test diode 100 of FIG. 1. The sensitivity of stress-induced defect detection using the polysilicon-bounded test diode/STI-bounded reference diode test system increases as the gate perimeter to area ratio increases. A polysilicon gate perimeter-to-area ratio of 1.48/microns has been found to give satisfactory sensitivity.

It should also be noted that that the optimization of the polysilicon-bounded test diode/STI-bounded reference diode test system for the detection and characterization of the semiconductor stress-induced defects is also a function of the overlap space of polysilicon gate 125 with P+ diffusion region 110 ("$O_P$" in FIG. 1) An "$O_P$" value of about 0.26 microns has been found to give satisfactory sensitivity.

The structures and the test methodologies of the present invention may be used to monitor formation of stress-induced defects during fabrication of semiconductor devices providing a powerful tool for improving those processes in order to lower the number of stress-induced defects those processes cause. By use of the structures and the test methodologies of the present invention, processes and tools that contribute stress-induced defects can be more easily identified and corrected.

It has been found because of the sensitivity of polysilicon-bounded test diode 100 (see FIGS. 1 and 2), such a device having intentionally created dielectric defects will function as an antifuse. We now turn our attention to this embodiment of the present invention. A diode (or antifuse) having a P+ diffusion region in an N-well is defined as a PN diode (or PN antifuse.) A diode (or antifuse) having a N+ diffusion region in a P-well is defined as an NP diode (or antifuse.)

FIGS. 15A through 15K are partial cross-sectional views illustrating fabrication of an antifuse according to the present invention. A top view is illustrated in FIG. 1 and the sections illustrated in FIGS. 15A through 15K are taken through line 2—2 of FIG. 1. FIGS. 15A through 15K illustrate formation of a PN diode. An NP diode may be formed in a similar manner. Only the processes illustrated in FIG. 15E and described below differ from the processes that may be used to fabricate polysilicon-bounded test diode 100. In the case of an antifuse the following dimensions are applicable (see FIG. 1): "$L_D$" is about 1 to 500 microns, "$W_D$" is about 1 to 10 microns, "$W_P$" is about 0.5 to 1.5 microns and "$O_P$" is about 0.1 to 0.6 microns.

Figure 15A:
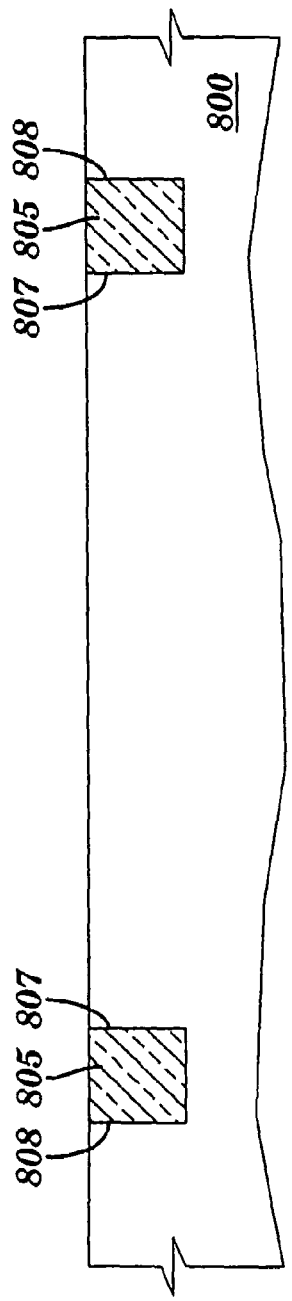

In FIG. 15A, a silicon substrate 800 is provided. A ring of STI 805 is formed in silicon substrate 800 by, for example, well known trench etch and chemical-mechanical-polish (CMP) processes. STI 805 has an inner perimeter 807 and an outer perimeter 808. In one example, silicon substrate 800 is doped P− with boron (B) at a concentration of 5E15 atoms/cm$^2$.

Figure 15B:
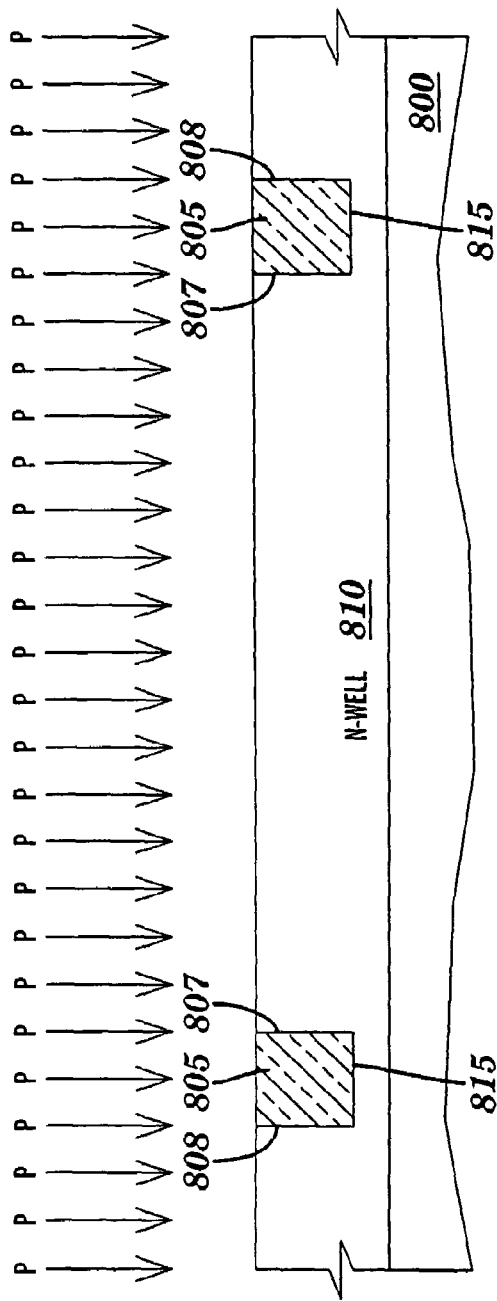

In FIG. 15B, an N-well 810 is formed by ion implantation of phosphorus (P.) In one example, multiple phosphorous implants are performed, a first P implant at an energy of 650 Kev and a dose of 2.4E13 atoms/cm$^2$, a second P implant at an energy of 300 Kev and a dose of 5E12 atoms/cm$^2$ and a third P implant at an energy of 35 Kev and a dose of 1E12 atoms/cm$^2$. For a NP diode, boron would be implanted to form a P-well instead of an N-well. In one example, for an NP diode, the first implant is B at an energy of 260 Kev and a dose of 2.2E13 atoms/cm$^2$, the second implant is B at an energy of 130 Kev and a dose of 6E12 atoms/cm$^2$ and the third implant is BF$_2$ at an energy of 35 Kev and dose of 1E12 atoms/cm$^2$. N-well 810 extend below a bottom 815 of STI 805.

In FIG. 15C, a gate dielectric layer 820 is formed on a top surface 825 of silicon substrate 800 and a polysilicon layer 830 is formed on a top surface 835 of the dielectric layer. In one example, dielectric layer 820 is thermal oxide about 10 to 120 Å thick and polysilicon layer 830 is about 1200 to 2000 Å thick formed by well known low pressure chemical vapor deposition (LPCVD) processes.

In FIG. 15D, dielectric layer 820 and polysilicon layer 830 are selectively removed by well know photolithographic and reactive ion etch (RIE) to form polysilicon gate 840. Polysilicon gate 840 has an inner perimeter 842 and an outer perimeter 843. Polysilicon gate 840 overlaps inner perimeter 807 of STI 805.

In FIG. 15E, a protective layer 845 is formed on top surface 825 of substrate 800. A photoresist layer 850 is formed and patterned (by well known photolithographic processes) on top of protective layer 845. Protective layer 845 is exposed only inside of antifuse area 855. In one, example, protective layer 845 is about 60 Å of thermal oxide. A heavy ion specie implant is performed in order to create defects in the inner perimeter 860 of gate dielectric 820. In one example, the heavy ion specie is germanium (Ge) implanted at an energy of 40 Kev, a dose of 3E15 atoms/cm$^2$ and an angle of 7 degrees. In a second example, the heavy ion specie is arsenic (As) implanted at an energy of 45 Kev, a dose of 5E15 atoms/cm$^2$ and an angle of 7 degrees. The higher the atomic weight of the heavy ion specie, the lower the implantation dose and energy required in order to induce the desired damage in inner perimeter 860 of gate dielectric 820. Then photoresist layer 850 is removed.

In FIG. 15F, protective layer 845 of FIG. 15E is removed. First silicon nitride spacers 865 are formed by well-known processes, on sidewalls 870 of polysilicon gates 840. In one example first silicon nitride spacers 865 are formed from about a 125 Å thick film of silicon nitride. Then an angled halo ion implant is performed. In the case of a PN diode, the halo implant includes a relatively low energy and low dose implant(s) selected from the group consisting of germanium, arsenic, indium, boron and combinations thereof. In the case of a NP diode, the halo implant includes a relatively low energy and low dose implant(s) selected from the group consisting of germanium, arsenic, boron (as BF$_2$) and combinations thereof.

Figure 15G:
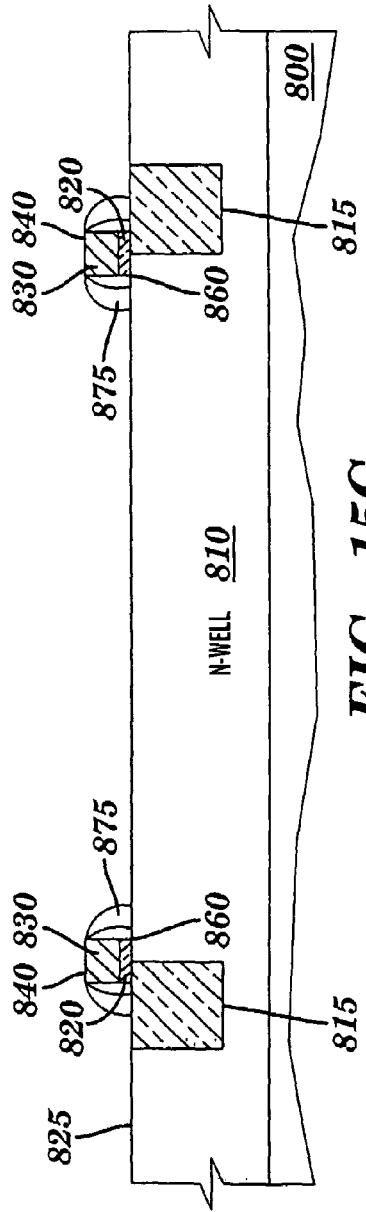

In FIG. 15G, second silicon nitride spacers 875 are formed over first silicon nitride spacers 865 by well-known processes. In one example second silicon nitride spacers 875 are formed from about a 800 Å thick film of silicon nitride.

Figure 15H:
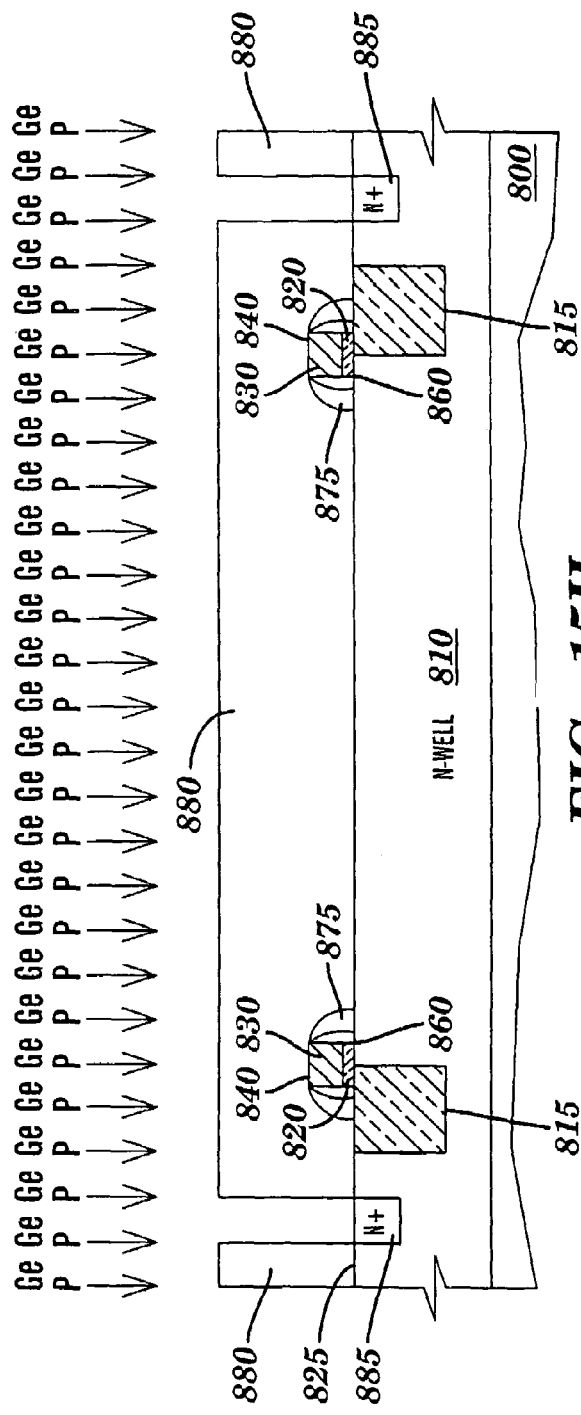

In FIG. 15H, a photoresist layer 880 is formed and patterned (by well known photolithographic processes) on top surface 825 of silicon substrate 800. An ion implant is performed to form N+ N-well contacts 885. The ion implant includes relatively low energy and low to high dose implant(s) selected from the group consisting of germanium, phosphorous and combinations thereof. In the case of a NP diode, the ion implant includes a relatively low energy and low to high dose implant(s) selected from the group consisting of germanium, boron and combinations thereof. Photoresist layer 880 is then removed.

Figure 15I:
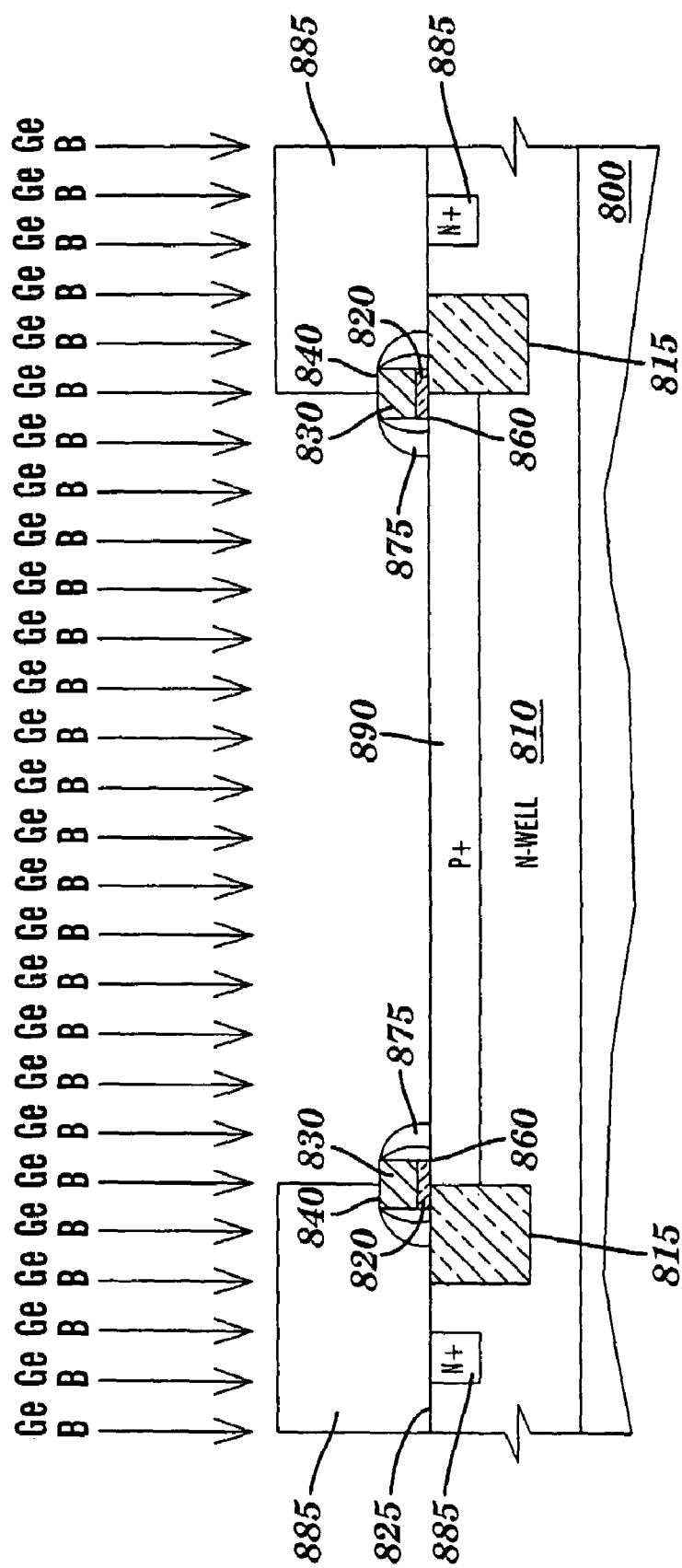

In FIG. 15I, a photoresist layer 885 is formed and patterned (by well known photolithographic processes) on top surface 825 of silicon substrate 800. An ion implant is performed to form a P+ diffusion region 890 in N-well 810 between STI 815. The ion implant includes relatively low energy and low to high dose implant(s) selected from the group consisting of germanium, boron and combinations thereof. In the case of a NP diode, the ion implant includes a relatively low energy and low to high dose implant(s) selected from the group consisting of germanium, phosphorus and combinations thereof to form an N+ diffusion region. Photoresist layer 885 is then removed.

In FIG. 15J, a silicide layer 895 is formed by well-known processes on N-well contact 885, P+ diffusion region 890 and on top of gates 840. In one example, silicide layer is cobalt silicide, titanium silicide or combinations thereof.

In FIG. 15K, a dielectric layer 900 is formed on top surface 825 of substrate 800. A multiplicity of stud contacts 905 are formed in dielectric layer 900 to make electrical contact to N-well contacts 905 and thence to N-well 810, gates 840 and P+ diffusion region 890.

Figure 16:
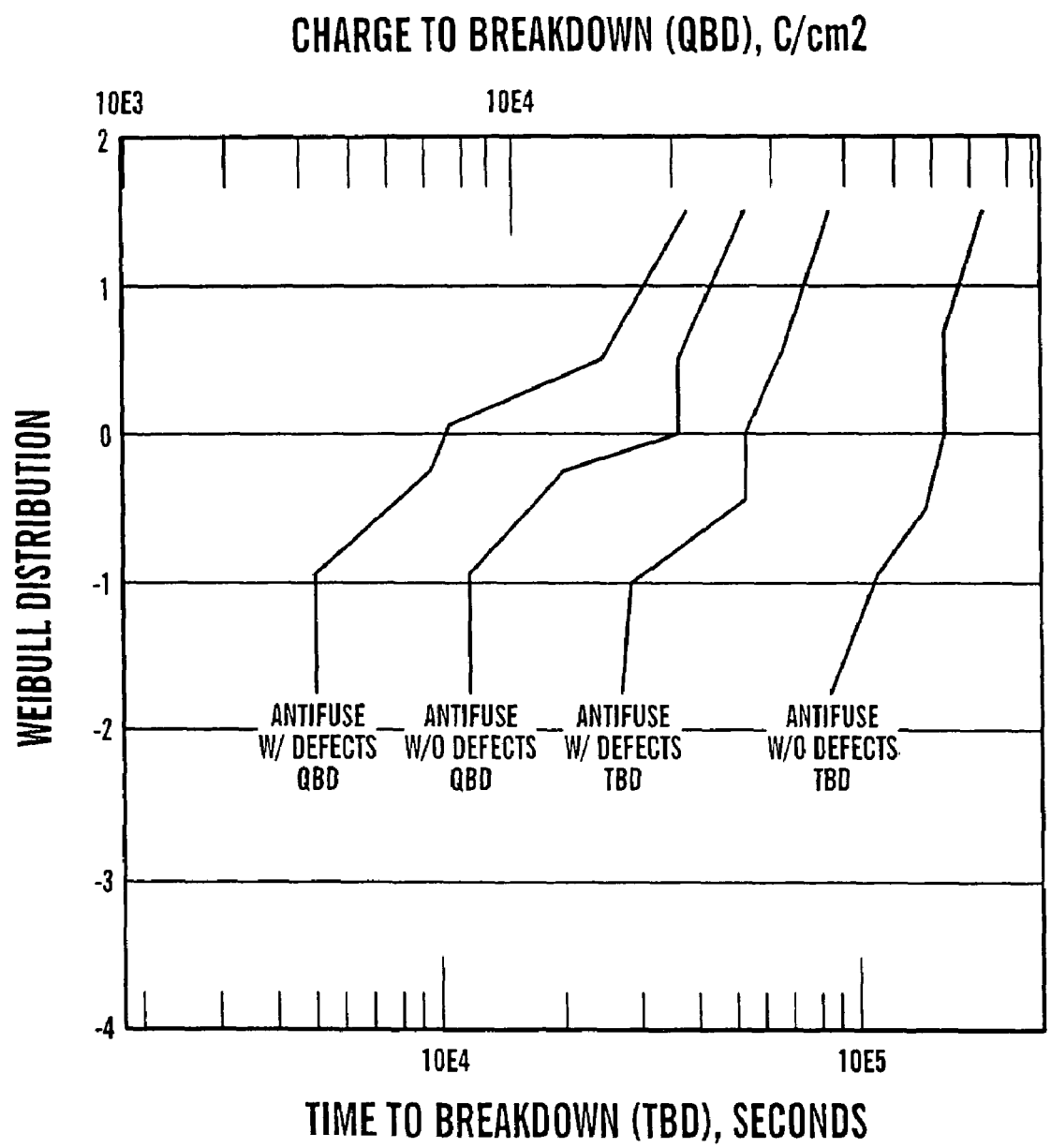
FIG. 16 is a Weibull distribution for Time-to-Fail ($T_{BD}$) and Charge-to-Breakdown ($Q_{BD}$) for a polysilicon-bounded test diode of FIG. 1 used as an antifuse, with and without stress-induced defects.

FIG. 16 is a Weibull distribution for Time-to-Fail ($T_{BD}$) and Charge-to-Breakdown ($Q_{BD}$) for a polysilicon-bounded test diode of FIG. 1 used as an antifuse, with and without stress-induced defects. FIG. 16 compares a PN antifuse represented having a gate dielectric thickness of 5 nm of thermal oxide and having received a 7 degree angled germanium ion implant of 3E14 atoms/cm2 at an energy of 40 Kev as illustrated in FIG. 15E and described above to a PN antifuse without the germanium implant. Stress conditions were polysilicon gate and N-well at ground, P+ diffusion at −6.3 volts and temperature at 160° C.

Figure 17:
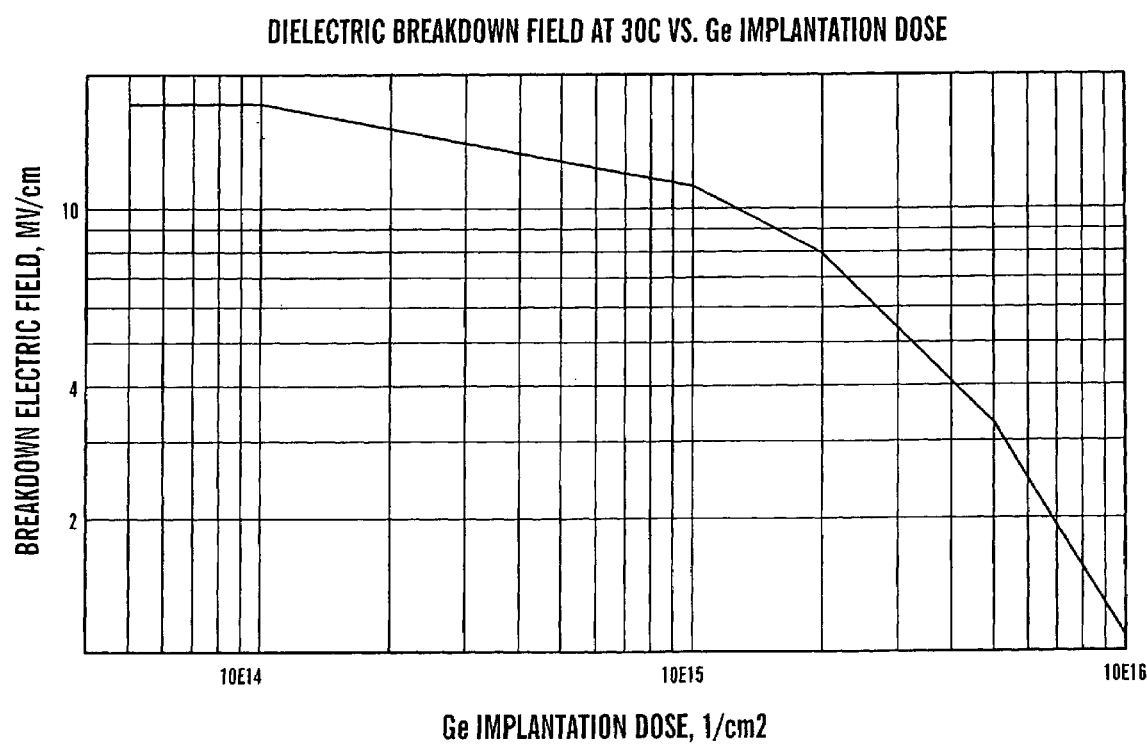
FIG. 17 is a plot of the dielectric breakdown field at 30° C. versus germanium implantation dose of the antifuse of FIG. 15K.

FIG. 17 is a plot of the dielectric breakdown field at 30° C. versus germanium implantation dose of the antifuse of FIG. 15K. For an antifuse to be reliably programmed a current density sufficient to induce a breakdown of the gate dielectric must flow through the dielectric. The voltage applied to the gate to obtain breakdown of the gate dielectric is the programming voltage. Implantation of heavy ion specie degrades the gate dielectric quality, effectively allowing more current through the gate dielectric for a given gate voltage then would occur without the implant thus causing more damage to the dielectric for a given voltage. Prior to heavy ion specie implantation, the gate dielectric breakdown electric field for dielectric thickness at or below 12 nm is about 14 MV/cm. FIG. 17 clearly shows that electric field required for breakdown of the gate dielectric is very sensitive to heavy ion specie implant dose and is significantly lowered even at relatively low implant doses.

Figure 18:
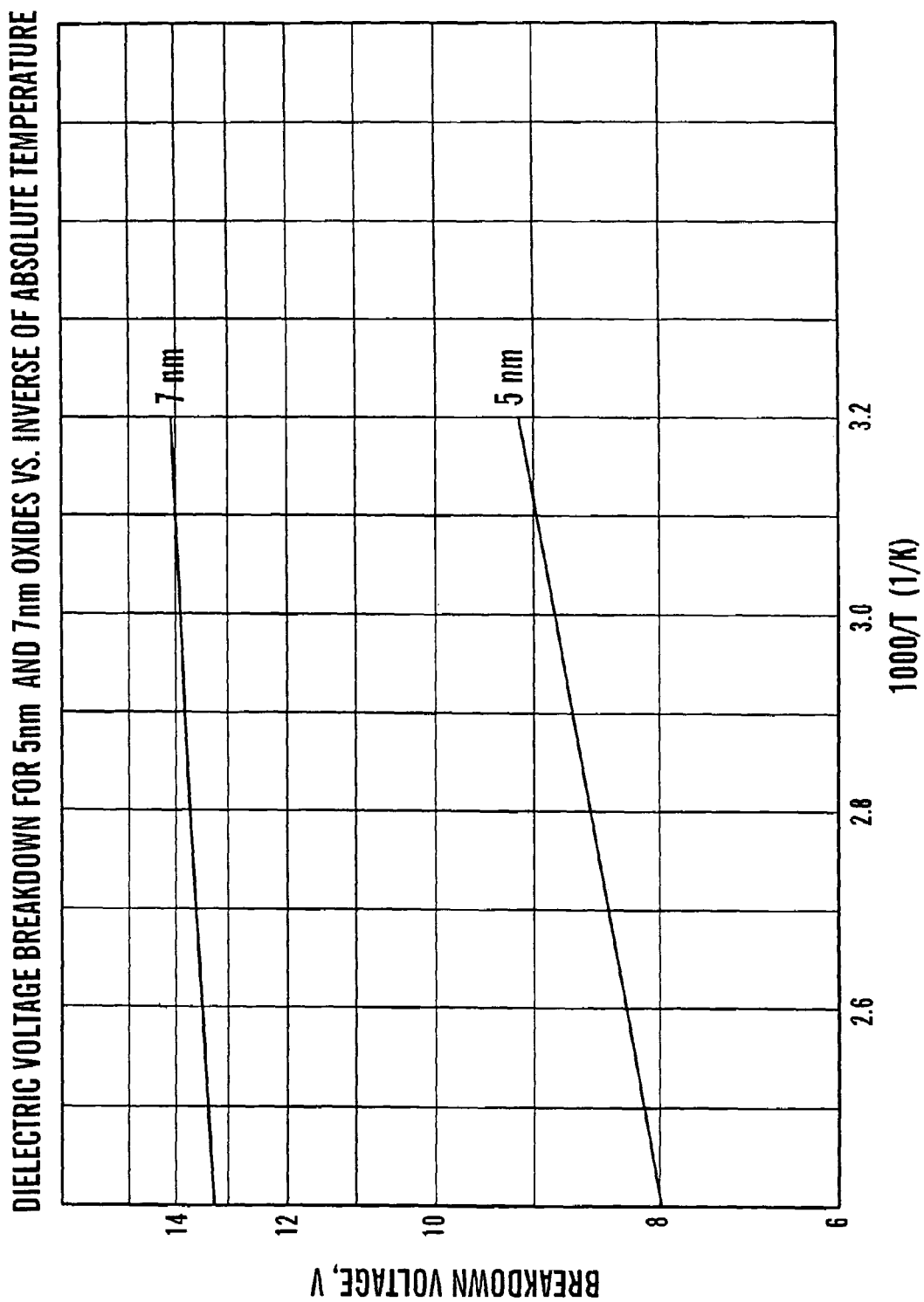
FIG. 18 is a plot of dielectric breakdown voltage versus the inverse of absolute temperature of the antifuses of FIG. 15K, fabricated with two thickness of dielectric.

FIG. 18 is a plot of dielectric breakdown voltage versus the inverse of absolute temperature of the antifuses of FIG. 15K, fabricated with two thickness of dielectric. FIG. 18 indicates that the breakdown voltage drop with increasing temperature has an activation energy of about 0.0124 eV. From the required energy to induce the required gate dielectric breakdown, it was determined that the minimum required programming current is under 2 micro amperes to be applied for a duration of about 0.05 seconds or a PN antifuse fabricated as illustrated in FIGS. 15A through.15G and described above and having a "$L_D$"=1.5 μm and a "$W_D$"=1.0 μm.

Figure 19:
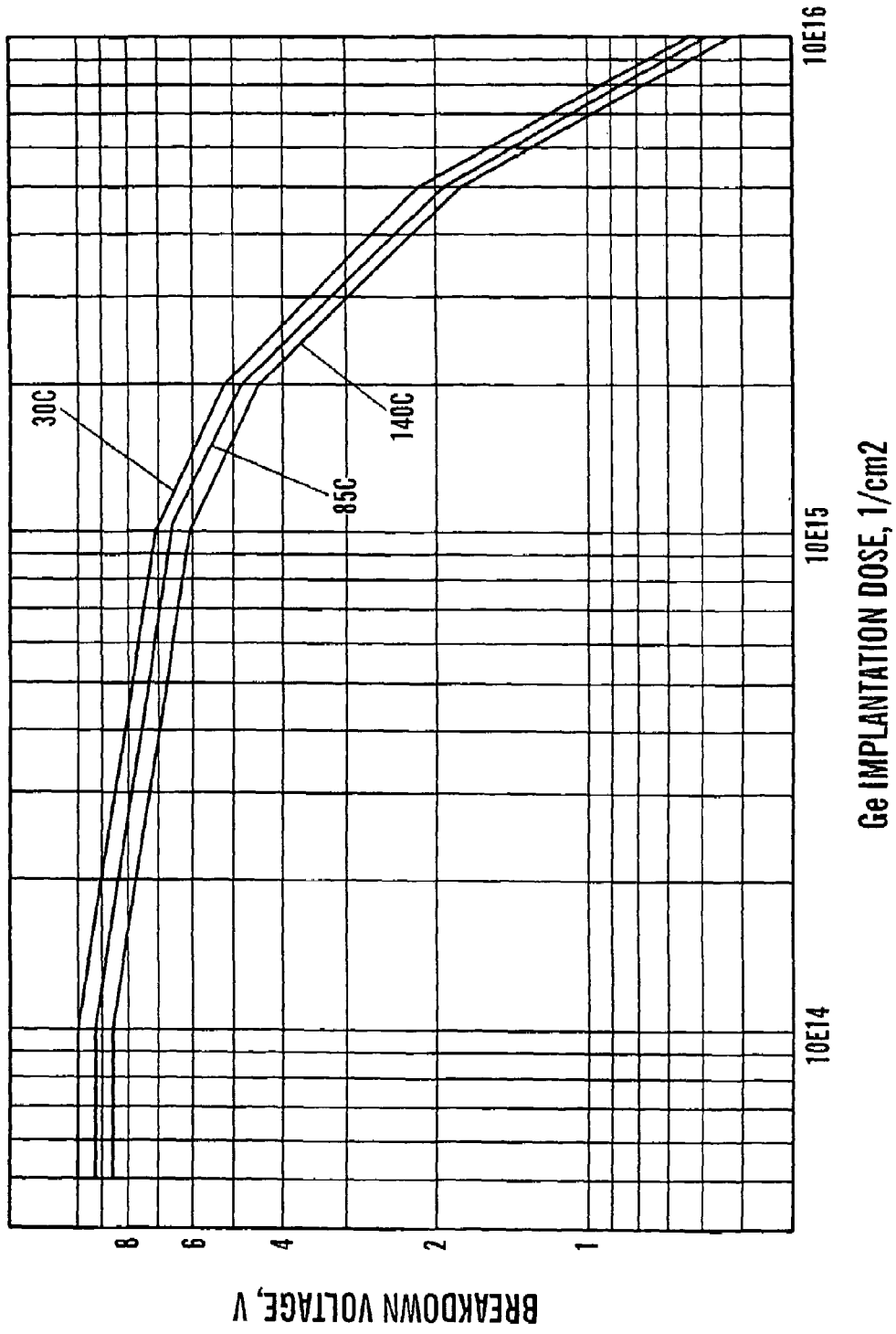
FIG. 19 is a plot of dielectric breakdown voltage versus germanium implantation dose of the antifuse of FIG. 15K at three temperatures.

FIG. 19 is a plot of dielectric breakdown voltage versus germanium implantation dose of the antifuse of FIG. 15K at three temperatures. Similar plots can be directly obtained for any other gate dielectric thickness using equation (2):

$$V_P = EBD \times T_{OX} \times AT \qquad (2)$$

Where:

$V_P$ is the required programming voltage;

EBD is the electric field required for breakdown;

$T_{OX}$ is the effective electrical thickness of the gate dielectric taking into account any polysilicon depletion or surface depletion effects; and AT is the temperature acceleration factor given by equation (3):

$$AT = \exp\{(\Delta H/K) \times [(1/T) - (1/TR)]\} \qquad (3)$$

Where ΔH is the activation energy (0.0124 eV from FIG. 18);

K is Boltzmann's constant;

T is the programming temperature in Kelvin; and

TR is the reference temperature in Kelvin (30° C.=303° K).

The area of the damaged edge of the gate dielectric following germanium implantation is very small (much less than one square micrometer.) Thus, the area of the antifuse fuse of the present invention may be very small, for example, as small as about 1–2 square micrometers. In fact, the area of the antifuse is limited only by the minimum critical dimension of the photolithographic system used to fabricate the antifuse.

The gate dielectric resistance prior to breakdown is in excess of $10^{10}$ ohms at one volt. The gate dielectric resistance following breakdown is equal to or less than 1000 ohms, at one volt. Thus, the ratio of the dielectric resistance prior to breakdown, to that following breakdown, at one volt, is greater than $10^7$.

The plots illustrated in FIGS. 17, 18 and 19 may be used to determine the required implantation dose of germanium necessary to induce breakdown at any desired voltage and temperature. In one example: for a polysilicon-bounded PN diode used as an antifuse, having a gate dielectric thickness of 5 nm and receiving a 7 degree germanium implantation at an energy of 40 Kev and a dose of 3E15 atom/cm$^2$, the required breakdown voltage is about 3.3V at 30° C.

Thus, it has been shown that the programming voltage of antifuse of the present invention is controlled by or tunable by heavy ion implant dose, gate dielectric thickness and temperature. It has further been shown that the programming voltage of antifuse of the present invention is dependent upon the area of the region of the gate dielectric damaged by heavy ion specie implant and independent of the total area of the antifuse.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore it is intended that the following claims cover all such modifications and changes as fall within the true spirit and scope of the invention.

What is claimed is:

1. A method for detecting semiconductor process stress-induced defects comprising:

providing a test DRAM, said test DRAM comprising a transfer device having a channel region between first and second P+ regions formed in a N-well in a silicon substrate and a gate formed over said channel region, said second P+ region electrically connected to a conductive core of a deep trench capacitor, said substrate acting as a second plate of said deep trench capacitor;

stressing said test DRAM; and monitoring said stressed test DRAM for spikes in first P+ region current during said stressing.

2. The method of claim 1, wherein said step of stressing comprises:

maintaining said test DRAM at an elevated temperature;

applying ground potential to said N-well and said first P+ region;

applying a voltage to said gate sufficient to turn on said transfer device; and applying a reverse bias ramping voltage to said silicon substrate.

3. The method of claim 2, wherein said ground potential is zero volts and said ramping voltage is ramped from 0 to −6 volts and said elevated temperature is 100 to 200° C.

4. A method for detecting semiconductor process stress-induced defects comprising:

providing a test DRAM, said test DRAM comprising a transfer device having a channel region between first and second P+ regions formed in a N-well in a silicon substrate and a gate formed over said channel region, said second P+ region electrically connected to a conductive core of a deep trench capacitor, said substrate acting as a second plate of said deep trench capacitor;

stressing said test DRAM; and monitoring said stressed test DRAM for spikes in gate current during said stressing.

5. The method of claim 4, wherein said step of stressing comprises:
maintaining said test DRAM at an elevated temperature;
applying ground potential to said N-well, said silicon substrate and said gate; and
applying a reverse bias ramping voltage to said first P+ region.

6. The method of claim 5, wherein said ground potential is zero volts and said ramping voltage is ramped from 0 to −6 volts and said elevated temperature is 100 to 200° C.

7. A method for detecting semiconductor process stress-induced defects comprising:
providing a test DRAM, said test DRAM comprising a transfer device comprising a channel region between first and second P+ regions formed in a N-well in a silicon substrate and a gate formed over said channel region, said second P+ region electrically connected to a conductive core of a deep trench capacitor, said substrate acting as a second plate of said deep trench capacitor;
stressing said test DRAM;
measuring during said stressing, for said test DRAM, the current through said first P+ region as a function of a forward bias voltage applied between said first P+ region and said N-well at at least a pre-selected forward bias voltage; and
determining the frequency distribution of the slope of said forward bias voltage versus said first P+ region current at said pre-selected forward bias voltage for said one or more test DRAMs.

8. The method of claim 7, wherein said step of stressing comprises:
applying ground potential to said N-well and said silicon substrate;
applying a voltage to said gate sufficient to turn off said transfer device; and
applying a forward bias ramping voltage between said first P+ region and said N-well.

9. The method of claim 8, wherein said ground potential is zero volts and said ramping voltage is ramped from 0 to 0.85 and said pre-selected voltage is between 0.4 and 0.5 volts.

10. The method of claim 7 further comprising:
providing one or more reference devices, said reference devices each comprising a third P+ region formed in a N-well in said silicon substrate, said P+ region electrically connected to a conductive core of a deep trench capacitor, said substrate acting as a second plate of said deep trench capacitor;
stressing each said reference device identically to said test DRAM;
measuring during said stressing, for each said reference device, the current through said third P+ region as a function of said forward bias voltage applied between said third P+ region and said N-well at at least said predetermined forward bias voltage;
determining the frequency distribution of the slope of said forward bias voltage versus said P+ region current at said pre-selected forward bias voltage for said one or more of reference devices; and
comparing said frequency distribution obtained from said reference devices to said frequency distribution obtained from said test DRAMs.

11. A method for detecting semiconductor process stress-induced defects comprising:
providing a test DRAM, said test DRAM comprising a transfer device comprising a channel region between first and second P+ regions formed in a N-well in a silicon substrate and a gate formed over said channel region, said second P+ region electrically connected to a conductive core of a deep trench capacitor, said substrate acting as a second plate of said deep trench capacitor;
stressing said test DRAM for a pre-determined amount of time; and
monitoring, after said stressing, each said test DRAM for soft breakdown.

12. The method of claim 11, wherein said step of stressing comprises:
maintaining said test DRAM at an elevated temperature;
applying ground potential to said first P+ region and said N-well;
applying a voltage to said gate sufficient to turn on said transfer device; and
applying a fixed reverse bias voltage to said silicon substrate; and
wherein said monitoring includes measuring a current through said first P+ diffusion as a function of time.

13. The method of claim 12, wherein said ground potential is zero volts, said fixed voltage is between −6.3 and 0 volts, said fixed time is 0.5 hours or more and said elevated temperature is 100 to 200° C.

14. The method of claim 11, wherein said step of stressing comprises:
maintaining said test DRAM at an elevated temperature;
applying ground potential to said N-well, said gate and said substrate;
applying a fixed reverse bias voltage to said first P+ region; and
wherein said monitoring includes measuring a current through said gate as a function of time.

15. The method of claim 14, wherein said ground potential is zero volts, said fixed voltage is between −6.3 and less than 0 volts, said fixed time is 0.5 hours or more and said elevated temperature is 100 to 200° C.

16. A method of fabricating an antifuse comprising:
providing a silicon substrate having a surface;
forming a ring of shallow trench isolation having an inner and an outer perimeter in said substrate extending from said surface of said substrate into said substrate;
forming a polysilicon gate overlapping said inner perimeter of said shallow trench isolation on said surface of said substrate, said polysilicon gate comprising a dielectric layer between said surface of said substrate and a polysilicon layer, said polysilicon gate having an inner and outer perimeter;
damaging said dielectric layer in a region along said inner perimeter of said polysilicon gate with a heavy ion specie implant to lower the breakdown voltage of said damaged dielectric layer in said region compared to the breakdown voltage in undamaged dielectric regions; and
forming a diffused region in said silicon substrate within the inner perimeter of said shallow trench isolation, said diffused region extending from said surface of said substrate into said substrate a depth not exceeding a depth of said shallow trench isolation.

17. The method of claim 16 wherein:
said diffused region has a length of 1 to 100 microns and a width of 1 to 10 microns;
said polysilicon gate has a width of 0.5 to 1.5 microns; and said polysilicon gate overlaps said diffused region by 0.1 to 0.6 microns.

18. The method of claim 16 wherein said heavy ion specie is selected from the group consisting of germanium ion and arsenic ion.

19. The method of claim 16 further comprising forming a diffused-well of opposite polarity doping from said diffused region.

* * * * *